United States Patent
Betts et al.

(10) Patent No.: US 10,514,588 B2
(45) Date of Patent: Dec. 24, 2019

(54) PHOTONICALLY-SAMPLED ELECTRONICALLY-QUANTIZED ANALOG-TO-DIGITAL CONVERTER

(71) Applicant: Photonic Systems, Inc., Billerica, MA (US)

(72) Inventors: Gary E. Betts, Escondido, CA (US); Charles H. Cox, Carlisle, MA (US)

(73) Assignee: Photonic Systems, Inc., Billerica, MA (US)

( * ) Notice: Subject to any disclaimer, the term of this patent is extended or adjusted under 35 U.S.C. 154(b) by 0 days.

(21) Appl. No.: 15/944,042

(22) Filed: Apr. 3, 2018

(65) Prior Publication Data

US 2019/0302571 A1    Oct. 3, 2019

(51) Int. Cl.
| | | |
|---|---|---|
| H03M 1/00 | (2006.01) | |
| G02F 7/00 | (2006.01) | |
| H03M 1/12 | (2006.01) | |

(52) U.S. Cl.
CPC ............ *G02F 7/00* (2013.01); *H03M 1/1245* (2013.01)

(58) Field of Classification Search
CPC .............................. G02F 7/00; H03M 1/1245
USPC ........................................ 341/155, 137, 133
See application file for complete search history.

(56) References Cited

U.S. PATENT DOCUMENTS

| | | | | |
|---|---|---|---|---|
| 5,010,346 A | * | 4/1991 | Hamilton | ................. G02F 7/00 250/227.12 |
| 6,288,659 B1 | | 9/2001 | Jalali et al. | |
| 7,050,164 B2 | * | 5/2006 | Kabuki | .................... G01J 3/28 356/319 |
| 8,618,966 B2 | * | 12/2013 | Kanter | ..................... G02F 7/00 341/137 |
| 8,963,751 B2 | * | 2/2015 | Marom | ............... H03M 1/1245 341/137 |
| 2004/0126048 A1 | * | 7/2004 | Dave | .................. G01N 21/4795 385/11 |
| 2011/0069975 A1 | * | 3/2011 | Liu | ....................... H04B 10/61 398/202 |

OTHER PUBLICATIONS

Anatol Khilo, et al., "Photonic ADC: Overcoming the Bottleneck of Electronic Jitter", Feb. 13, 2012, pp. 4454-4469, vol. 20, No. 4, Optics Express.

(Continued)

*Primary Examiner* — Peguy Jean Pierre
(74) *Attorney, Agent, or Firm* — Kurt Rauschenbach; Rauschenbach Patent Law Group, LLC

(57) ABSTRACT

A photonically-sampled electronically-quantized analog-to-digital converter generates an optical signal comprising a series of optical pulses. The optical signal is split into a first and a second optical path. The split optical signal is detected in the first path and then the detected optical signal is converted to a reference digital signal. The split optical signal in the second path is modulated with an input RF signal and a plurality of demultiplexed RF-modulated optically-sampled signals is generated from the modulated optical signal. The plurality of demultiplexed RF-modulated optically-sampled signals is then pulse broadened, detected, and converted to a plurality of sampled-RF digital signals. The reference digital signal and the plurality of sampled-RF digital signals are digital signal processed to generate a digital representation of the input RF signal.

49 Claims, 11 Drawing Sheets

(56) References Cited

OTHER PUBLICATIONS

A. H. Nejadmalayeri, et. al,. "A 16-fs aperture jitter photonic ADC: 7.0 ENOB at 40 GHz", Proc. Conf. on Lasers and Electro-optics (CLEO), 2011, paper CThl4.

P.W. Juodawlkis, et al, "Optically sampled analog-to-digital converters," IEEE Trans. Microwave Theory Tech., vol. 49, No. 10, pp. 1840-1853, Oct. 2001.

E.I. Ackerman, et al, "Signal-to-noise performance of two analog photonic links using different noise reduction techniques," 2007 International Microwave Symposium Conference Digest, pp. 51-54, Jun. 3-8, 2007.

S.J. Spector, et al, "Integrated Optical Components in Silicon for High Speed Analog to Digital Conversion," Proc. SPIE, vol. 6477, pp. 64770O-1-64770O-14, 2007.

J.C. Twichell and R. Helkey, "Phase-encoded optical sampling for analog-to-digital converters," IEEE Photon. Technol. Lett., vol. 12, No. 9, pp. 1237-1239, Sep. 2000.

\* cited by examiner

_US 10,514,588 B2_

PHOTONICALLY-SAMPLED ELECTRONICALLY-QUANTIZED ANALOG-TO-DIGITAL CONVERTER

The section headings used herein are for organizational purposes only and should not be construed as limiting the subject matter described in the present application in any way.

INTRODUCTION

Analog-to-digital conversion (ADC) is an important and widely-used electronic system function that transforms analog, or time-continuous, signals into digital, or discrete-time signals that are most commonly binary signals including 1's and 0's. This crucial function allows the resulting digitized signals to be further processed by a wide variety of low-cost and/or sophisticated processing only available with digital signal processing electronics. The ADC process consists of two main steps: sampling and quantization. Sampling obtains the value of the waveform at a particular instant in time; quantization determines the digital, typically binary, representation of a sample. The fidelity of the digital representation of an analog signal is related to several important performance parameters of the analog-to-digital conversion sampling and quantization system including bandwidth, speed, time and amplitude jitter, and noise. Many of these parameters are limited by the capability of the electronic sampling circuits.

Photonic sampling has been developed to eliminate some of the bottlenecks of electronic sampling. One feature of photonic sampling is that it can provide substantially lower timing jitter of when the sample is taken. See, for example, A. H. Nejadmalayeri, et. al., "A 16-fs aperture jitter photonic ADC: 7.0 ENOB at 40 GHz", Proc. Conf. on Lasers and Electro-optics (CLEO), 2011, paper CThI4. Another feature of photonic sampling is that in some architectures, photonic sampling can increase the bandwidth and reduce the noise of the analog-to-digital conversion.

BRIEF DESCRIPTION OF THE DRAWINGS

The present teaching, in accordance with preferred and exemplary embodiments, together with further advantages thereof, is more particularly described in the following detailed description, taken in conjunction with the accompanying drawings. The skilled person in the art will understand that the drawings, described below, are for illustration purposes only. The drawings are not necessarily to scale, emphasis instead generally being placed upon illustrating principles of the teaching. The drawings are not intended to limit the scope of the Applicant's teaching in any way.

DESCRIPTION OF VARIOUS EMBODIMENTS

Reference in the specification to "one embodiment" or "an embodiment" means that a particular feature, structure, or characteristic described in connection with the embodiment is included in at least one embodiment of the teaching. The appearances of the phrase "in one embodiment" in various places in the specification are not necessarily all referring to the same embodiment.

It should be understood that the individual steps of the methods of the present teachings may be performed in any order and/or simultaneously as long as the teaching remains operable. Furthermore, it should be understood that the apparatus and methods of the present teachings can include any number or all of the described embodiments as long as the teaching remains operable.

The present teaching will now be described in more detail with reference to exemplary embodiments thereof as shown in the accompanying drawings. While the present teachings are described in conjunction with various embodiments and examples, it is not intended that the present teachings be limited to such embodiments. On the contrary, the present teachings encompass various alternatives, modifications and equivalents, as will be appreciated by those of skill in the art. Those of ordinary skill in the art having access to the teaching herein will recognize additional implementations, modifications, and embodiments, as well as other fields of use, which are within the scope of the present disclosure as described herein.

The present teaching describes a method and apparatus for photonically-sampled, electrically-quantized analog-to-digital converters that in various embodiments can have any combination of five features that improve performance and have relatively low cost and complexity as well as relatively low power consumption. These features include single channel normalization, passive detector-to-ADC interfacing, subtraction prior to the analog-to-digital conversion, post-modulator dispersion, and low noise figure analog-to-digital conversion.

Figure 1:
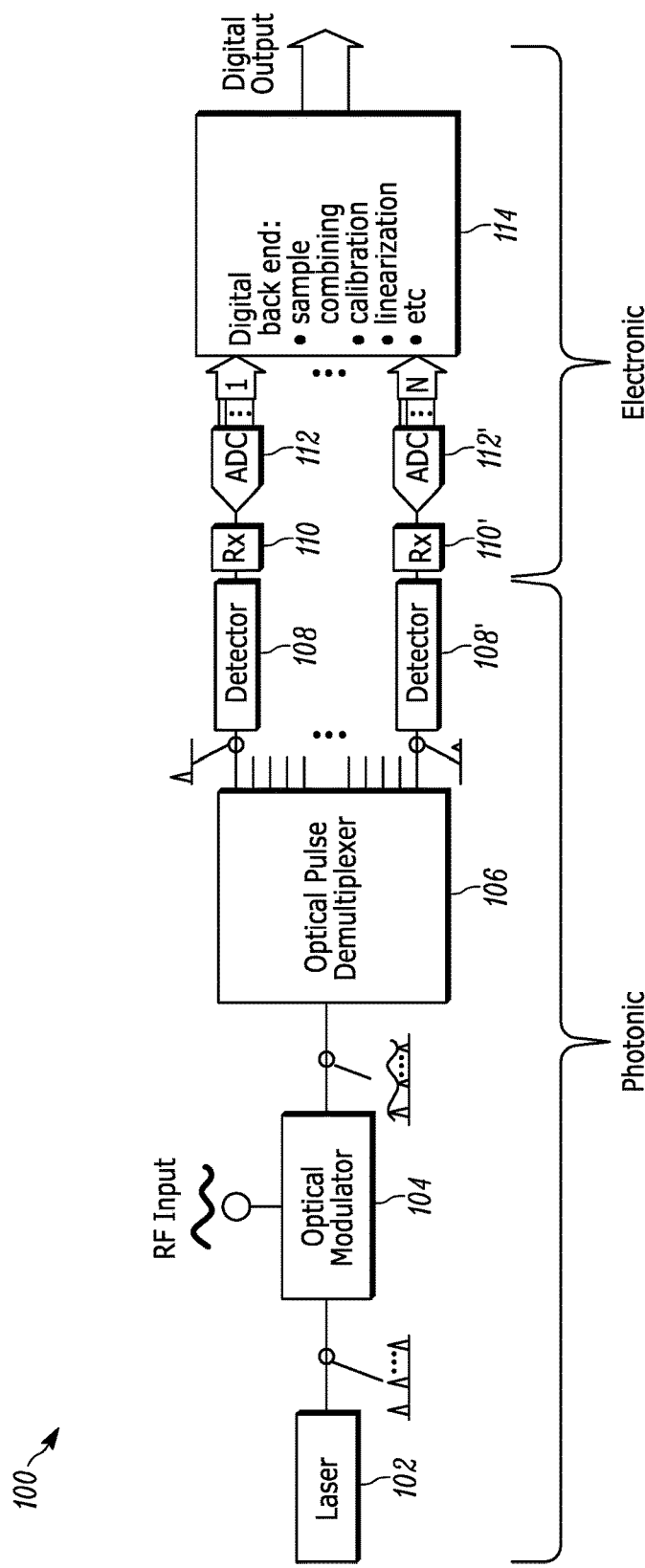
FIG. 1 illustrates a schematic of a prior art photonic analog-to-digital converter architecture that has one bank of electronic, analog-to-digital converters on the output of the modulator.

FIG. 1 is a schematic of a prior art photonic analog-to-digital converter architecture 100. A pulsed laser 102 provides a high-speed, low-jitter pulse train to the modulator 104. Pulse trains as described herein can refer to pulses that are spaced periodically, i.e. uniformly, in time. Pulse trains as described herein can also refer to pulses spaced arbitrarily in time, i.e. such that the time between pulses is variable. The output of the modulator 104 is a train of pulses representing a sampled version of the electrical input signal that is to be converted to a digital representation. These pulses are sequentially sent to an optical pulse demultiplexer 106. A typical prior art implementation of the optical pulse demultiplexer 106 requires a massive, 1×N, optical switch. At present the only practical way to implement optical switches with the required speed is by using a binary cascade of 1×2 switches. Thus if N=32, realizing a 1×32 switch would require 31 optical switches, which would require a custom, integrated-optic assembly. This represents a major impediment to realizing this approach when the cost of fabricating such custom switch arrays is combined with the switch drive circuitry that needs to be synchronized with the sample pulses.

A plurality of optical detectors 108, 108' is optically coupled to the output of the optical pulse demultiplexer 106. Each of the plurality of detectors 108, 108' is electrically connected to one of a plurality of electronic receivers 110, 110' which contain active electronic devices and/or circuits that amplify, provide impedance transformation, etc. The electronic receivers provide the interface between the output of the detectors 108, 108' and the input to the ADC 112, 112'. In addition to the cost of the high-speed digital amplifiers in the electronic receivers, such amplifiers can consume a considerable amount of power. Each of the plurality of electronic receivers 110 is then electronically connected to one of a plurality of electronic analog-to-digital converters 112, 112' so that each electronic analog-to-digital converter only sees pulses at its electronic sampling rate. The electronic sampling rate of each analog-to-digital converter is many times slower than the optical sampling rate. A digital back end process unit 114 is then used for various processing tasks.

FIG. 1 illustrates a prior art photonic analog-to-digital converters that uses short optical pulses to sample electrical signal applied to the optical modulator. The pulses are converted from optical to electrical pulses to enable sampling by the electronic analog-to-digital converters 112, 112' using a detector 108, 108' followed by the electronic receiver circuits 110, 110'. The sampling function works best with short pulses for reasons that will be discussed in conjunction with FIG. 4.

Figure 2:
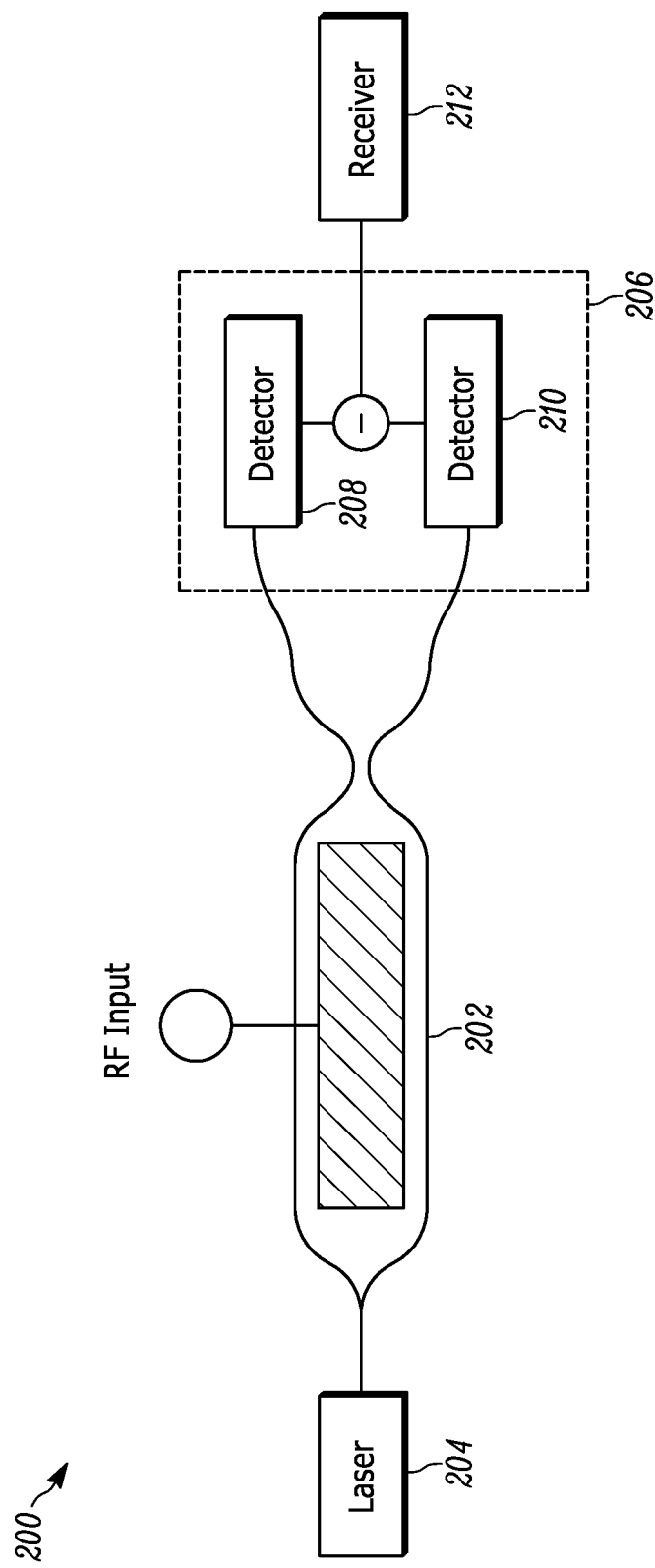
FIG. 2 illustrates a known Mach-Zehnder modulator balanced detection system.

FIG. 2 illustrates a known Mach-Zehnder modulator balanced detection system 200. The balanced detection system 200 includes Mach-Zehnder modulator 202 having an RF input and an optical input that is coupled to the output of a laser 204. The Mach-Zehnder modulator 202 outputs shown in FIG. 2 are complementary, i.e. they are, at least ideally, of equal amplitudes that are 180° out of phase with respect to one another. The two arms of the Mach-Zehnder modulator 202 are optically coupled to a balanced detector 206 that includes a first and second detector 208, 210 in a balanced configuration having an output that is electrically connected to an input of a receiver 212.

In operation, an input signal causes a so-called positive-polarity signal in the first detector 208 and a so-called negative-polarity signal in the second detector 210. Noise at the input, however, appears as common-mode noise in the two outputs. That is the noise has the same polarity in both outputs. Thus, when the first and second detector 208, 210 outputs are subtracted, the noise is cancelled and the signal is doubled as compared to the output of one of the first and the second detectors 208, 210. The details of the balanced detection system 200 are described in E. I. Ackerman, et al, "Signal-to-noise performance of two analog photonic links using different noise reduction techniques," 2007 International Microwave Symposium Conference Digest, pp. 51-54, Jun. 3-8, 2007.

Figure 3:
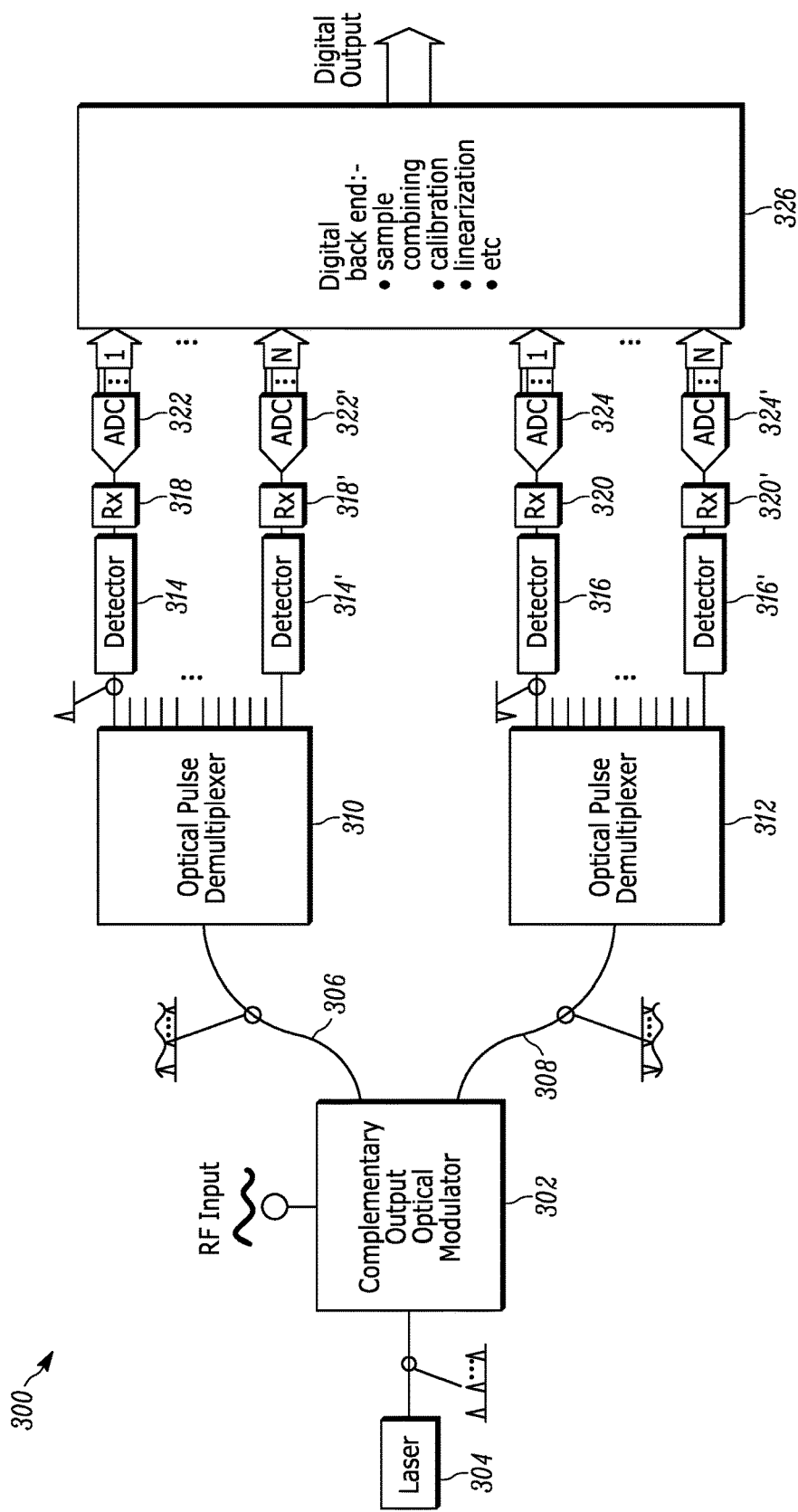
FIG. 3 illustrates a known photonic analog-to-digital converter that includes a complementary output modulator feeding a balanced output configuration that includes two banks of electronic analog-to-digital converters, one on each complementary output of the modulator.

FIG. 3 illustrates a known photonic analog-to-digital converter 300 that includes a balanced output configuration that includes a bank of N electronic analog-to-digital converters on each complementary-output of the modulator 302. The photonic analog-to-digital converter 300 is similar to the photonic analog-to-digital converter 100 that was described in connection with FIG. 1. However, the photonic analog-to-digital converter 300 includes a complementary output optical modulator 302 such as the Mach-Zehnder modulator 202 that was described in connection with FIG. 2.

A pulsed laser 304 provides a high-speed, low-jitter pulse train to the input of the complementary output optical modulator 302. Complementary trains of pulses representing a sampled version of the electrical input signal propagate on each of a first 306 and second arm 308 of the output of the modulator 302. These pulses are sequentially sent to a first optical pulse demultiplexer 310 and second optical pulse demultiplexer 312. Hence this approach requires two of the massive, optical switch arrays that were described in conjunction with FIG. 1. A first and second plurality of optical detectors 314, 314' 316, 316' are optically coupled to the output of the first and second optical pulse demultiplexers 310, 312. Each of the plurality of detectors in the first and second plurality of optical detectors 314, 314', 316, 316' is electrically connected to one of a plurality of the first and second plurality of electronic receivers 318, 318', 320, 320'. Each of the plurality of electronic receivers in the first and second plurality of electronic receivers 318, 318', 320, 320' is then electronically connected to one of a plurality of electronic analog-to-digital converter in the first and the second plurality of analog-to-digital converters 322, 322', 324, 324' so that each electronic analog-to-digital converter (ADC) only sees pulses at its electronic sampling rate. A digital back end process unit 326 is then used for various processing tasks.

The subtraction of the complementary outputs is done digitally with signal processing hardware after the analog-to-digital conversion process. This configuration has been used on prior art photonic analog-to-digital converter demonstrations. See, for example, P. W. Juodawlkis, et al, "Optically sampled analog-to-digital converters," IEEE Trans. Microwave Theory Tech., vol. 49, pp. 1840-1853, 2001. See also reference, S. J. Spector, et al, "Integrated Optical Components in Silicon for High Speed Analog to Digital Conversion," Proc. SPIE, vol. 6477, pp. 647700-1-647700-14, 2007.

The subtraction of complementary outputs substantially improves the signal integrity of the digital representation of the analog signal. In addition to noise cancellation, the full-complementary configuration shown in FIG. 3 allows recovery of the input intensity by summing the outputs from the two complementary analog-to-digital converters corresponding to the same pulse on each output. This enables more complex linearization and normalization methods, such as the arcsine linearization of the Mach-Zehnder modulator, and cancellation of AM noise sidebands on large signals when they come from optical intensity noise. See, for example, J. C. Twichell and R. Helkey, "Phase-encoded optical sampling for analog-to-digital converters," IEEE Photon. Technol. Lett., vol. 12, pp. 1237-1239, September 2000. However, these advantages come at the expense of doubling the number of electronic ADCs required, which in turn increases the size, weight, power and/or cost of the overall unit.

Figure 4:
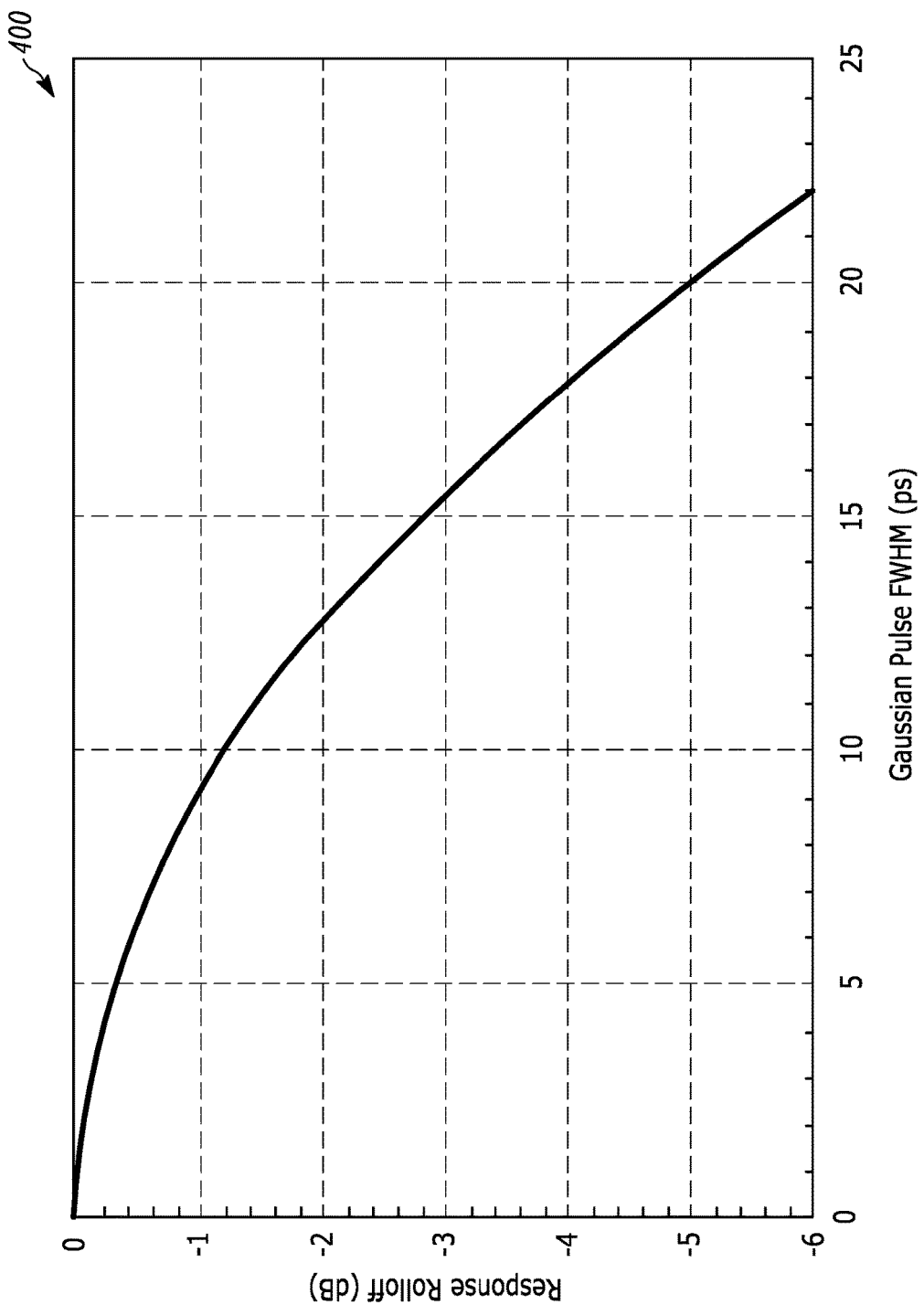
FIG. 4 illustrates a known plot of the response roll-off of a known photonic analog-to-digital converter as a function of pulse width for a 20-GHz sine wave input.

One feature of the photonically-sampled, electrically-quantized analog-to-digital converters of the present teaching is optimizing for both less roll-off and high detection efficiency. FIG. 4 illustrates a plot 400 of the response roll-off of a prior art photonic analog-to-digital converter as a function of pulse width for a 20-GHz sine wave input. Short pulses are favored because they experience less roll-off. Reducing the roll-off becomes more important as the analog input frequency increases. On the other hand, detection is more efficient with longer pulses. This is because of two factors. First, short pulses can result in high peak power which causes the detector to become nonlinear. Second, the timing jitter of the electronic analog-to-digital converter sampler leads to increased noise when the input signal to the electronic analog-to-digital converter is varying rapidly.

Figure 5:
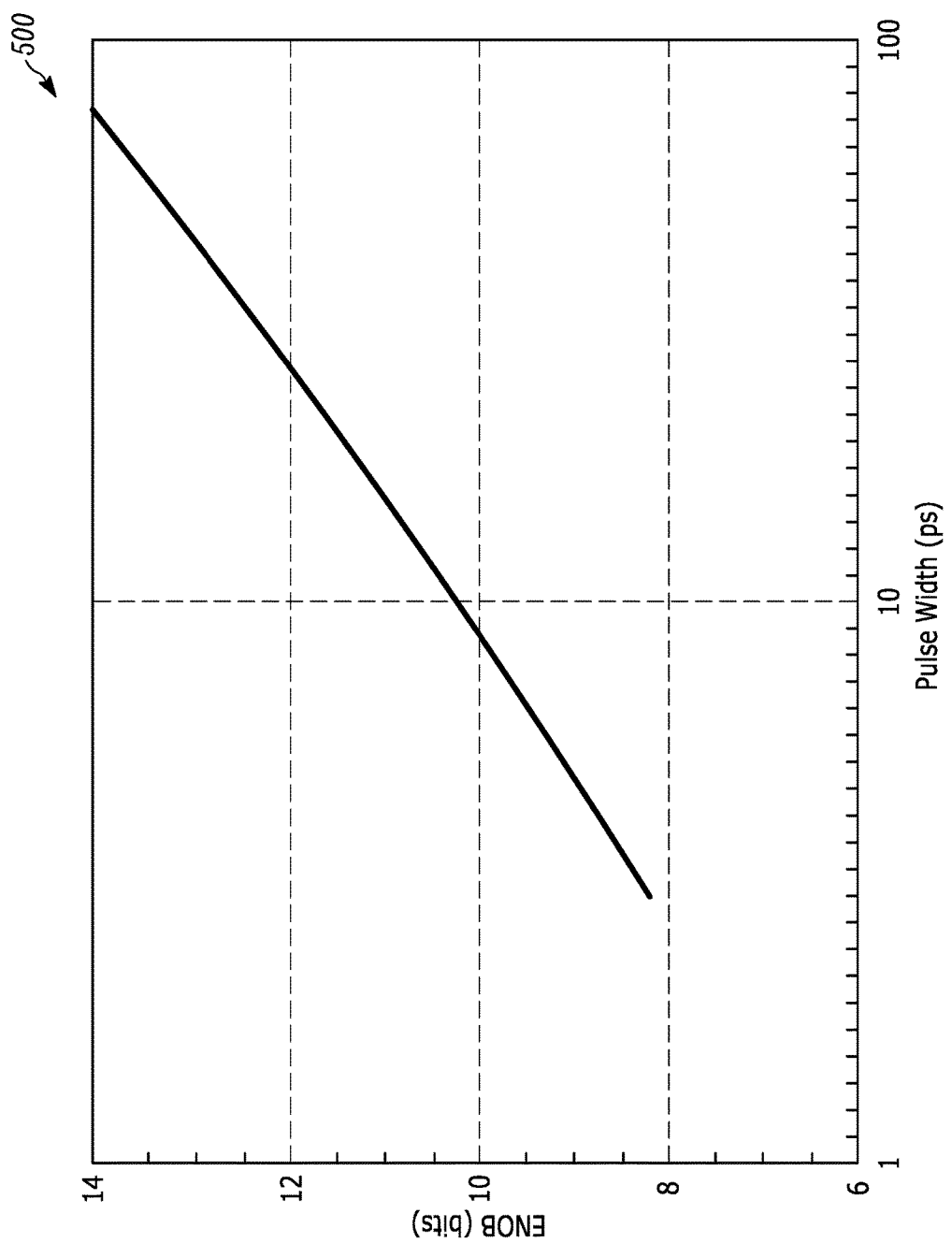
FIG. 5 illustrates a known plot of the Effective Number of Bits (ENOB) of a known photonic analog-to-digital converter as a function of pulse width.

One feature of the photonically-sampled, electrically-quantized analog-to-digital converters of the present teaching is optimizing for both high bandwidth and high Effective Number of Bits (ENOB). FIG. 5 illustrates a plot 500 of the ENOB of a prior art photonic analog-to-digital converter as a function of pulse width. The effective number of bits is a measure of the signal-to-noise and distortion ratio of an analog-to-digital converter. The plot in FIG. 5 shows how the effective number of bits increases with increasing pulse width for a simple low-pass-filter circuit following the detector. A higher effective number of bits is desirable. Thus from the point of view of increasing ENOB longer pulses are preferred, which is counter to the need for short pulses to increase bandwidth. The present teaching describes a system and method that resolves these opposing constraints.

Prior art photonic analog-to-digital converters choose either a compromise pulse width that is not ideal for either the sampling or the detection function, or they use a complex circuit between the detector and the analog-to-digital converter. See, for example, P. W. Juodawlkis, et al, "Optically sampled analog-to-digital converters," IEEE Trans. Microwave Theory Tech., vol. 49, pp. 1840-1853, 2001. Generally, using a complex circuit becomes very difficult to implement as the speed of the electronic analog-to-digital converter increases. The disadvantages of prior art photonic analog-to-digital converter technology are the cost, complexity, and the power required for the large amount of digital back end electronics used for sampling, calibration, combining, cancellation, and linearization.

What is needed are analog-to-digital converter systems and methods that perform more functions in the optical domain as compared to prior art photonic analog-to-digital converter technology. Furthermore, what is needed is a photonic analog-to-digital converter system and method that eliminates the challenges associated with handling short-optical-pulse samples in the electronic domain.

One feature of the photonically-sampled electronically-quantized analog-to-digital converter of the present teaching is that it provides a photonic analog-to-digital converter that uses a smaller quantity of components in a less complex configuration of sampling and quantizing electronics than known photonic analog-to-digital converters while achieving substantially the same improvement in signal integrity of the sampled signal by cancelling noise, linearizing the signal, and suppressing AM sidebands.

Figure 6:
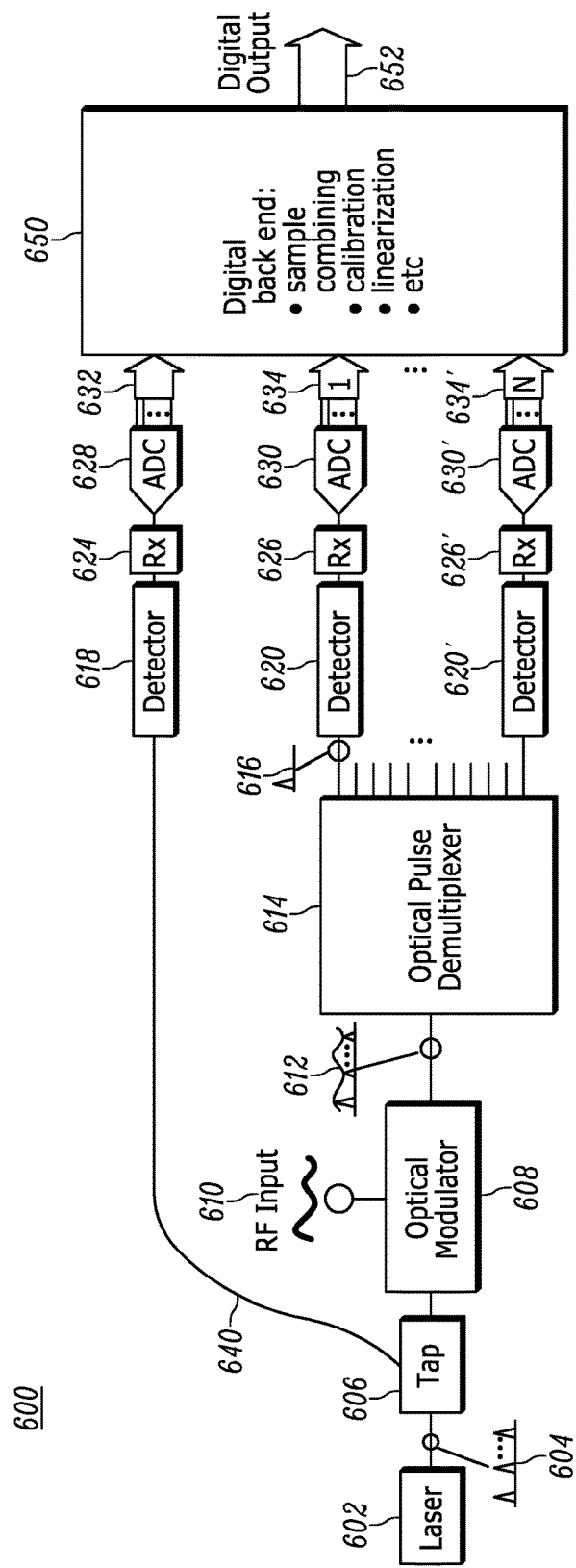
FIG. 6 illustrates an embodiment of the photonically-sampled electronically-quantized analog-to-digital converter system comprising a single-channel normalization scheme according to the present teaching.

FIG. 6 illustrates an embodiment of the photonically-sampled electronically-quantized analog-to-digital converter system 600 comprising a single-channel normalization scheme according to the present teaching. The embodiment illustrated in FIG. 6 includes a laser 602, or other optical transmitter, that generates a series of nominally equal amplitude short optical pulses of light in an optical pulse train 604. An optical splitter, or tap 606, splits the optical pulse train into two or more paths. One path proceeds to an optical modulator 608. The optical modulator 608 can be any type of optical modulator. In some embodiments, the optical modulator 608 is a Mach-Zehnder-type optical modulator.

The portion of the optical pulse train 604 that passes through the optical modulator 608 is modulated with an RF input signal 610 whose digital representation is desired. The optical modulator 608 imposes an RF input modulation 610 onto the optical pulses of the optical pulse train 604 to produce an optically-sampled pulse train 612. The RF-modulated optically-sampled pulse train 612 is incident on an optical pulse demultiplexer 614, which splits incoming optical signals into multiple output ports. One skilled in the art will appreciate that numerous types of optical pulse demultiplexer 614 architectures can be used. In some embodiments, the optical demultiplexer 614 splits the incoming optical signal into different output ports based on the time slot of the optical pulse. Demultiplexed optically-sampled signals 616 from each output of the optical pulse demultiplexer 614 are passed to respective detectors 620, 620' that convert the optical signals into electrical signals.

The electrical signals are then passed to electronic receivers 626, 626' that condition the signal, and then to analog-to-digital converters 630, 630', that quantize the electrical analog signals to a digital signals. These signals are then input into N inputs 634, 634' of a digital signal processor 650 comprising a bank of digital back-end electronics and processing that provides various functions such as combining, calibration, and linearization. The digital signal processor 650 provides a digital output 652. The digital output 652 is a digital representation of the RF input modulation 610. The digital output 652 can be in any one of numerous formats, such as serial or parallel, straight binary or Gray code, high bandwidth, and/or low bandwidth, depending on the particular known digital back end signal processing used.

The portion of the optical pulse train 604 that follows path 640 forms the single-channel normalization path. The optical pulses in path 640 propagate to detector 618. The detected signal is then passed to the electrical receiver 624 that conditions the signal, and then to a reference analog-to-digital converter 628 that converts the electrical analog signal to a digital signal to produce a reference input at input 632 to the digital signal processor 650.

The embodiment of FIG. 6 is referred to herein as a single-channel normalization. The single-channel normalization architecture advantageously uses a single detector 618 and a single analog-to-digital converter 628 to perform the functions that in prior art implementations, such as shown in FIG. 3, required a second optical pulse demultiplexer, 312, as well as a whole bank of N complementary detectors, 316, N receivers, 320 and N analog-to-digital converters, 324.

A feature of the present teaching is that essentially all the optical intensity noise from the laser is at frequencies that are less than half the optical pulse train repetition rate because any higher frequency noise is aliased back into this frequency range according to the Nyquist sampling theory. Single-channel normalization is thus able to cover the entire frequency range of the input optical intensity noise. Within this bandwidth, it will perform the full normalization and noise cancellation functions. That is, the single-channel normalization scheme will suppress input optical intensity noise, AM sideband noise due to input optical intensity noise, and the reference input 632 will provide the reference signal at a signal level that enables arcsine and other linearization algorithms. While single-channel normalization will not suppress noise at frequencies above half the electronic analog-to-digital sample rate, which is the bandwidth of the photonically-sampled, electronically quantized analog-to-digital converter, this limitation is usually not significant because most optical intensity noise and intensity variation important for normalization is at low frequency. Differences in channel transmission through the pulse demultiplexer 614 appear as channel gain offsets, not as noise. These differences in channel transmission can be compensated by routine analog-to-digital converter calibration algorithms.

As compared to the configuration shown in FIG. 3, only about half of the number of analog-to-digital converters 630, 630' and consequently only about half the number of inputs to the digital signal processor is required in the single-channel normalization architecture. The electronic analog-to-digital converters account for a large fraction of both the electrical power consumed and the total system cost for photonic analog-to-digital converters of the prior art. Thus, the embodiment shown in FIG. 6 of the current teaching advantageously provides a substantial reduction in cost, complexity and electrical power.

One skilled in the art will appreciate that the single-channel normalization scheme described herein can be used in combination with any type of photonic analog-to-digital converter architecture. Using the single-channel normalization scheme of the present teaching with known photonic analog-to-digital converter substantially reduces overall cost, complexity and power consumption, with only a small reduction in performance.

Figure 7A:
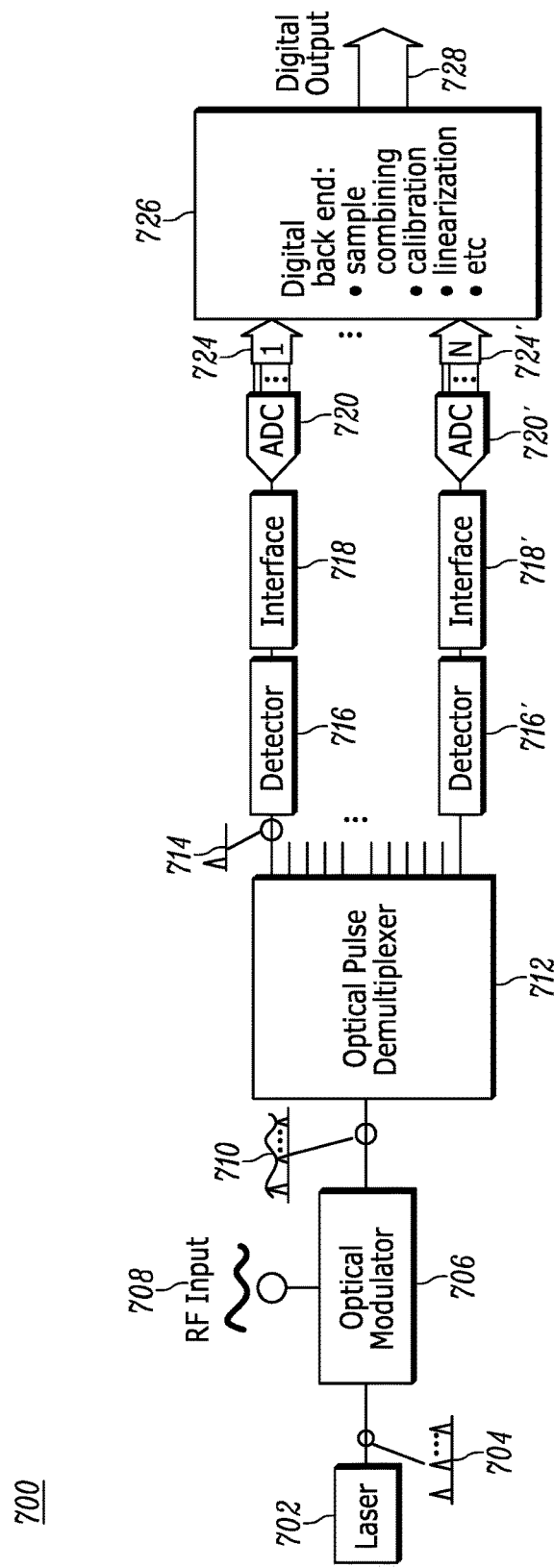
FIG. 7A illustrates an embodiment of the photonically-sampled electronically-quantized analog-to-digital converter system with passive detector-to-ADC interface according to the present teaching.

One feature of some of the photonically-sampled electronically-quantized analog-to-digital converter system embodiments of the present teaching is that some embodiments eliminate the need for an active receiver interface between the photodetector and ADC. FIG. 7A illustrates an embodiment of the photonically-sampled electronically-quantized analog-to-digital converter 700 with passive detector-to-ADC interface according to the present teaching. The laser 702, or other optical source, generates an optical signal that is a train of optical pulses 704. The laser 702 is connected to an optical modulator 706. The optical modulator 706 can be any type of optical modulator. In some embodiments, the optical modulator 706 is a Mach-Zehnder-type optical modulator. An RF input signal 708 whose digital representation is desired is input to the modulator 706. The optical modulator 706 imposes the RF input modulation 708 onto the optical pulses of the optical pulse train 704 to produce an optically-sampled pulse train 710.

The RF-modulated optically-sampled pulse train 710 is incident on an optical pulse demultiplexer 712, which splits incoming optical signals into multiple output ports. One skilled in the art will appreciate that numerous types of optical pulse demultiplexer 712 architectures can be used. In some embodiments, the optical demultiplexer 712 splits the incoming optical signal into different output ports based on the time slot of the optical pulse. Demultiplexed optically-sampled signals 714 from each output of the optical pulse demultiplexer 712 are passed to respective detectors 716, 716' that convert the optical signals into electrical signals.

The electrical signal output of the detectors 716, 716' are input to an interface 718, 718'. The interface 718, 718' connects to an ADC 720, 720', that quantize the electrical analog signals to digital signals. These signals are then input into N inputs 724, 724' of a digital signal processor 726 comprising a bank of digital back-end electronics and processing that provides various functions such as combining, calibration, and linearization. The digital signal processor 726 provides a digital output 728. The digital output 728 is a digital representation of the RF input modulation 708. The digital output 728 can be in any one of numerous formats, such as serial or parallel, straight binary or Gray code, high bandwidth, and/or low bandwidth, depending on the particular known digital back end signal processing used.

In some embodiments, the interface 718, 718' performs passive frequency response shaping and impedance transformation on the respective electrical signal output from the detectors 716, 716'. In various other embodiments, interface 718, 718' performs other passive filter functions. Interface 718, 718' contains only passive elements and does not contain any active electronic devices and/or circuits that amplify. The reason the amplifier can be eliminated is because the optical path from laser 702 to photodetector 716, 716' is designed such that the photodetector 716, 716' produces sufficient current, when combined with the sensitivity of the ADC 720, 720', to drive the ADC 720, 720' to full scale. Eliminating the need for post-detector amplification can significantly reduce the cost, complexity and power consumption of the photonically-sampled, electrically quantized ADC 700.

In some embodiments, the interface 718, 718' between the output of the detector 716, 716' and the input to the ADC 720, 720' is a separate component. In some embodiments, the interface 718, 718' is integrated with the detector 716, 716' output and/or ADC 720, 720' input. For example, in embodiments for which the interface 718, 718' needs to include low pass filtering, then a separately identifiable low pass filter can be included. Alternatively a low pass filter function of the interface 718, 718' can be realized using the output resistance of the detector 716, 716' output together with the input capacitance of the ADC 720, 720'. Similarly, in embodiments for which the interface 718, 718' performs a function that requires inductance, then the inductance of the photodetector 716, 716' bond wire alone, or a length of conductor alone, or a combination of both can be used for the interface 718, 718'. It should be understood that the interface element that performs only passive function according to the present teaching can be used in various other embodiments that do not include a demultiplexer. It will be understood by those skilled in the art that these embodiments only include a single detector and single analog-to-digital converter that are connected via the passive interface.

Figure 7B:
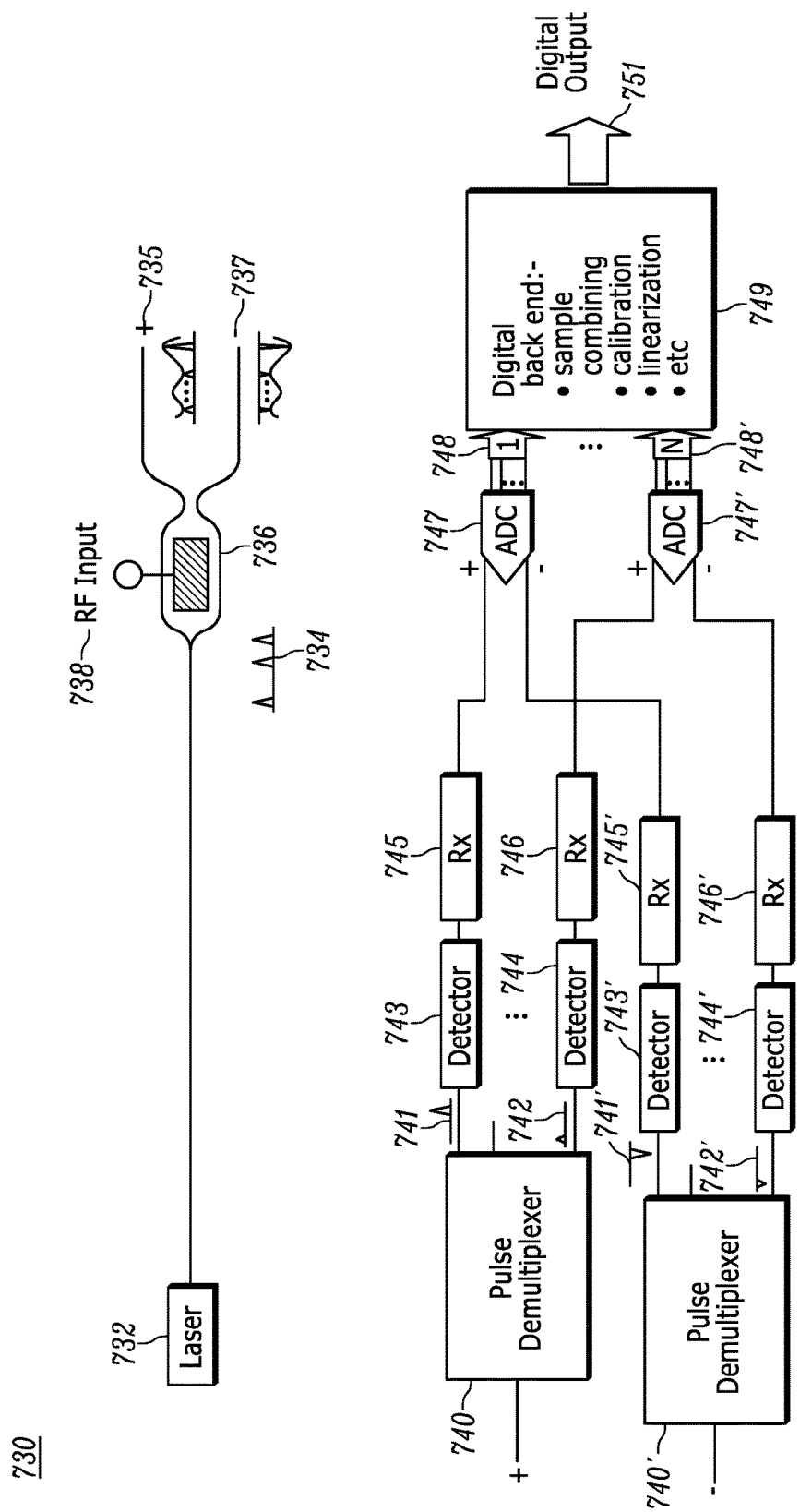
FIG. 7B illustrates an embodiment of the photonically-sampled electronically-quantized analog-to-digital converter system with subtraction before the ADC according to the present teaching.

One feature of the present teaching is performing subtraction prior to, or at the input to, the analog-to-digital converters. This subtraction provides, for example, cancellation of input optical intensity noise. FIG. 7B illustrates an embodiment of the photonically-sampled electronically-quantized analog-to-digital converter 730 with subtraction before the ADC according to the present teaching. The laser 732, or other optical source, generates an optical signal that is a train of optical pulses 734.

The output of the laser 732 is optically coupled to an input of an optical modulator 736 with balanced outputs. The optical modulator 736 with balanced or complementary outputs is shown as a Mach-Zehnder modulator 736. The optical modulator 736 imposes an RF input 738 on the train of optical pulses 734, and generates optically-sampled signals at complementary outputs 735, 737. The complementary outputs 735, 737 represent equal and opposite amplitudes, i.e., a so-called positive output 735 and a so-called negative output 737.

The optically-sampled signals generated at the positive complementary output 735 of the optical modulator 736 passes to a first pulse demultiplexer 740, and the optically-sampled signals generated at the negative complementary output 737 of the optical modulator 736 passes to a second pulse demultiplexer 740'. The demultiplexers 740, 740' can use any one of various demultiplexer architectures, such as wavelength-division and time-division demultiplexing. The outputs of the demultiplexers 740, 740' generate separate demultiplexed optically-sampled signals 741, 741', 742, 742' from the optically-sampled signals at the input of the demultiplexers 740, 740'.

The outputs of the demultiplexers 740, 740' are optically coupled to the optical detectors 743, 743', 744, 744' where they are converted to electrical signals. The outputs of the optical detectors 743, 743', 744, 744' are electrically connected to receivers 745, 745', 746, 746'. The receivers 745, 745', 746, 746' provide the detected signals to the respective positive and negative inputs of the ADC 747, 747'. In some embodiments, the receivers 745, 745', 746, 746' are replaced by interfaces, such as the interfaces 718, 718' described in connection with FIG. 7A.

Performing subtraction prior to, or at the input to, the analog-to-digital converters advantageously reduces the number of ADC's 474, 474'. The outputs of the receivers 745, 746 are electrically connected to positive inputs of analog-to-digital-converters 747, 747'. The outputs of the receivers 745', 746' are electrically connected to negative inputs of analog-to-digital-converters 747, 747'. By performing subtraction prior to, or at the input to, the analog-to-digital converters 747, 747', the present teaching uses N ADCs 747, 747'. This is half the number of analog-to-digital converters of known apparatus, such as the apparatus shown in FIG. 3, which required 2N ADCs. In some embodiments balanced detectors are used to perform the subtraction function prior to being interfaced to single-ended analog-to-digital converters as an alternative to the use of balanced or differential input analog-to-digital converters that is shown in FIG. 7B. Since the total power consumed by the photonically-sampled, electronically quantized ADC 730 is often dominated by the power consumed by the electronic ADCs, cutting the number of electronic ADCs in half will substantially reduce the overall power consumed by the photonically-sampled, electronically-quantized ADC of the present teaching.

The output of the analog-to-digital converters 747, 747' provide N inputs 748, 748', etc. to the digital signal processor 749. The digital signal processor 749 provides a digital output 751. The digital output 751 is a digital representation of the RF input 738 that can be one of numerous types of data formats, including serial or parallel, straight binary or Gray code, high bandwidth and/or low bandwidth depending on the particular known digital back end electronics used. It should be understood that performing subtraction prior to, or at the input to, the analog-to-digital converters according to the present teaching can be used in various other embodiments that do not include a demultiplexer. It will be understood by those skilled in the art that these embodiments only include a single detector and single analog-to-digital converter in which subtraction is performed at the input or prior to the input.

The photonically-sampled electronically-quantized analog-to-digital converter 730 shown in FIG. 7B uses complementary detection. Therefore, every channel separately has the input optical intensity noise cancelled. Consequently, the input intensity noise is cancelled over the full bandwidth of the photonic analog-to-digital converter. The balanced detectors do not provide AM sideband noise suppression, nor do they provide normalization for the arcsine or other linearization algorithms. In some embodiments, these functions are accomplished by a single-channel normalization up to the bandwidth of a single analog-to-digital converter, which is half its sample rate. A key insight of the present teaching is that a complementary detection results in a level of cancellation that is good enough for most practical systems because they are able to tolerate a higher level of uncancelled AM sideband noise and un-normalized high-frequency fluctuations than they can tolerate uncancelled baseband optical intensity noise.

Figure 7C:
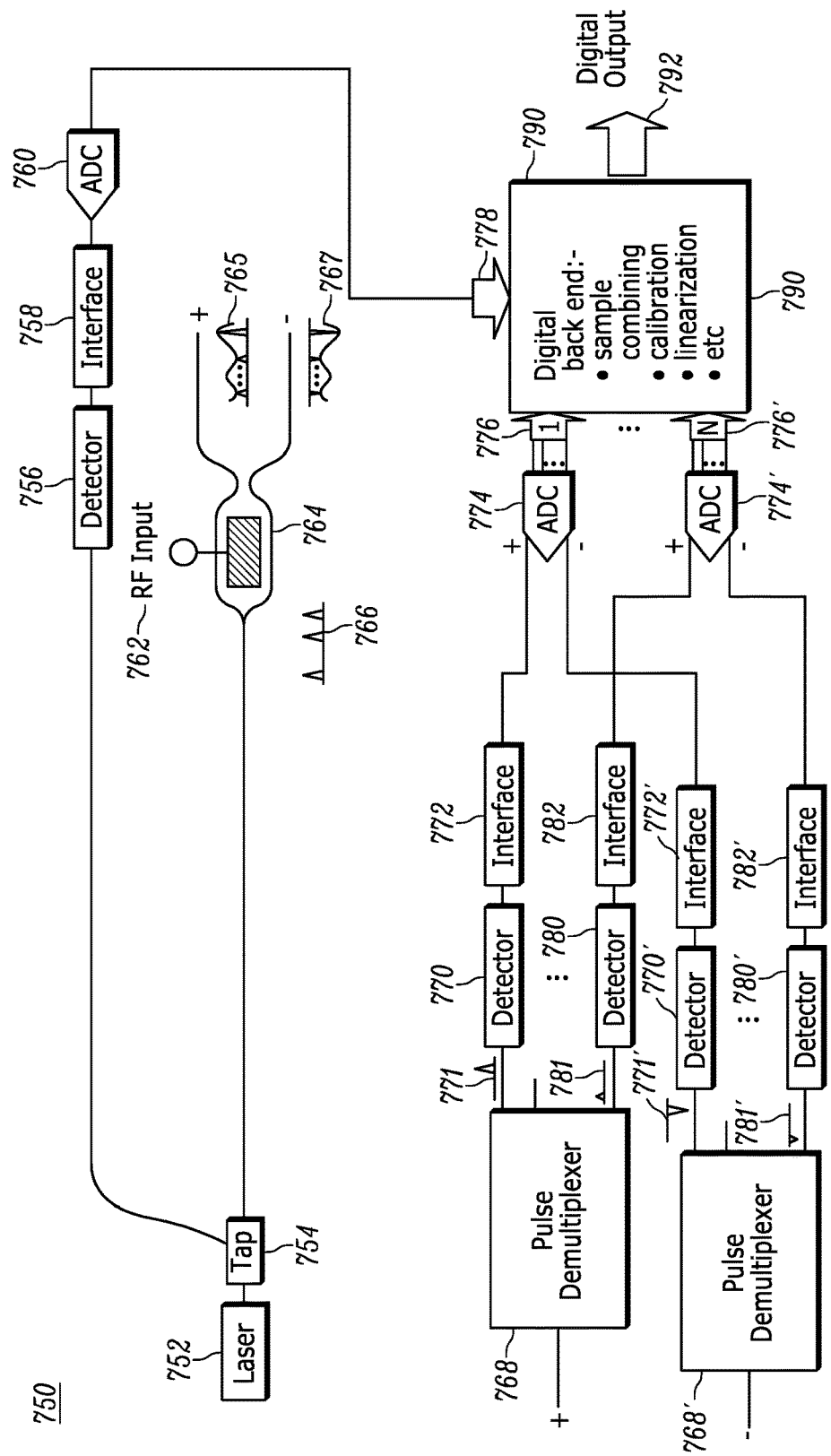
FIG. 7C illustrates an embodiment of the photonically-sampled electronically-quantized analog-to-digital converter system with passive detector-to-ADC interfaces and subtraction before the ADCs, as well as single-channel normalization according to the present teaching.

FIG. 7C illustrates an embodiment of the photonically-sampled electronically-quantized analog-to-digital converter 750 with passive detector-to-ADC interface and subtraction before the ADC as well as single-channel normalization according to the present teaching. The laser 752, or other optical source, generates an optical signal that is a train of optical pulses 766. The optical signal is split by a tap or splitter 754. The first portion of the optical beam from the splitter 754 is directed to an input to an optical detector 756. An output of the optical detector 756 is electrically connected to a passive detector-to-ADC interface 758. The laser pulse power, optical path impairments from the laser to the detector, detector response, and ADC sensitivity are chosen such that no electrical amplification is required in the interface 758, and yet the ADC is driven at full scale. In some embodiments, the ADC is driven with sufficient current to produce a drive at greater than half-scale of the ADC. The output of the interface 758 is electrically connected to an input of a reference analog to digital converter 760. The output of the reference analog-to-digital converter 760 is electrically coupled to an input 778 of the digital signal processor 790.

In some embodiments, interface 758 performs passive frequency response shaping and impedance transformation. In various other embodiments, interface 758 performs other passive filter functions. Interface 758 contains only passive elements and does not contain any active electronic devices and/or circuits that amplify. The reason the amplifier can be eliminated is because the optical path from laser to photodetector 756 is designed such that the photodetector 756 produces sufficient current, when combined with the sensitivity of the ADC 760, to drive the ADC 760 to full scale. Eliminating the need for post-detector amplification can significantly reduce the cost, complexity and power consumption of the photonically-sampled, electrically quantized ADC.

In some embodiments, the interface 758 between the output of the detector 756 and the input to the ADC 760 is a separate component. In some embodiments, the interface 758 is integrated with the detector 756 output and/or ADC 760 input. For example, in embodiments for which the interface 758 needs to include low pass filtering, then a separately identifiable low pass filter can be included. Alternatively a low pass filter function of the interface 758 can be realized using the output resistance of the detector 756 output together with the input capacitance of the ADC 760.

Similarly, in embodiments for which the interface 758 performs a function that requires inductance, then the inductance of the photodetector 756 bond wire alone, or a length of conductor alone, or a combination of both can be used for the interface 758.

The second output of the splitter 754 is optically coupled to an input of the optical modulator 764 with balanced outputs. The optical modulator 764 with balanced or complementary outputs is shown as a Mach-Zehnder modulator 764. The optical modulator 764 imposes an RF input 762 on the train of optical pulses 766, and generates optically-sampled signals 765, 767 at complementary outputs. The optically-sampled signals 765, 767 at complementary outputs represent equal and opposite amplitudes, i.e., a so-called positive output and a so-called negative output.

The optically-sampled signals 765 generated at the positive complementary output of the optical modulator 764 passes to a first pulse demultiplexer 768, and the optically-sampled signals 767 generated at the negative complementary output of the optical modulator 764 passes to a second pulse demultiplexer 768'. The demultiplexers 768, 768' can use any one of various demultiplexer architectures, such as wavelength-division and time-division demultiplexing. The outputs of the demultiplexers 768, 768' generate separate demultiplexed optically-sampled signals 771, 771', 781, 781' from the optically-sampled signals 765, 767.

The outputs of the demultiplexers 768, 768' are optically coupled to the optical detectors 770, 770', 780, and 780' where they are converted to electrical signals. The outputs of the optical detectors 770, 770', 780, and 780' are electrically connected to passive detector-to-ADC interfaces 772, 772', 782, and 782'. These passive interfaces 772, 772', 782, and 782' are similar in design to the interface 758 described above. The interfaces 772, 772', 782, and 782' provide the detected signals to the respective ADC 774, 774'. In some applications, the interfaces 772, 772', 782, and 782' can be low-pass filters (LPF), in other applications the interfaces 772, 772', 782, and 782' can be band-pass filters (BPF). Also the interfaces 772, 772', 782, and 782' can be either a separate element as shown in FIG. 7C, or they can be incorporated into one of the existing elements. An example of the latter case would be to implement a low pass filter function by selecting the frequency response of the detector to roll off at the desired frequency.

One feature of the present teaching is performing subtraction prior to, or at the input to, the analog-to-digital converters. The outputs of the interfaces 772, 782 are electrically connected to positive inputs of analog-to-digital-converters 774, 774'. The outputs of the interfaces 772', 782' are electrically connected to negative inputs of analog-to-digital-converters 774, 774'. By performing subtraction prior to, or at the input to, the analog-to-digital converters, the present teaching uses N ADCs 774, 774'. This is half the number of analog-to-digital converters of prior art apparatus, such as the apparatus shown in FIG. 3, which required 2N ADCs. In some embodiments balanced detectors are used to perform the subtraction function prior to being interfaced to single-ended analog-to-digital converters as an alternative to the use of balanced or differential input analog-to-digital converters that is shown in FIG. 7C. Since the total power consumed by the photonically-sampled, electronically quantized ADC is often dominated by the power consumed by the electronic ADCs, cutting the number of electronic ADCs in half will substantially reduce the overall power consumed by the photonically-sampled, electronically-quantized ADC of the present teaching.

The output of the analog-to-digital converters 774, 774' provide N inputs 776, 776', etc. to the digital signal processor 790. The digital signal processor 790 provides a digital output 792. The digital output 792 is a digital representation of the RF input 762 that can be one of numerous types of data formats, including serial or parallel, straight binary or Gray code, high bandwidth and/or low bandwidth depending on the particular known digital back end electronics used. The digital signal processor 790 uses the output of the reference analog-to-digital converter 760 to improve signal integrity of the digital representation of the input RF signal by normalization, linearization, noise cancellation and AM sideband suppression.

The photonically-sampled electronically-quantized analog-to-digital converter 750 shown in FIG. 7C uses complementary detection. Therefore, every channel separately has the input optical intensity noise cancelled. Consequently, the input intensity noise is cancelled over the full bandwidth of the photonic analog-to-digital converter. The balanced detectors do not provide AM sideband noise suppression, nor do they provide normalization for the arcsine or other linearization algorithms. These functions are accomplished by the single-channel normalization, up to the bandwidth of a single analog-to-digital converter, which is half its sample rate. A key insight of the present teaching is that this results in a level of cancellation that is good enough for most practical systems because they are able to tolerate a higher level of uncancelled AM sideband noise and un-normalized high-frequency fluctuations than they can tolerate uncancelled baseband optical intensity noise.

Figure 8:
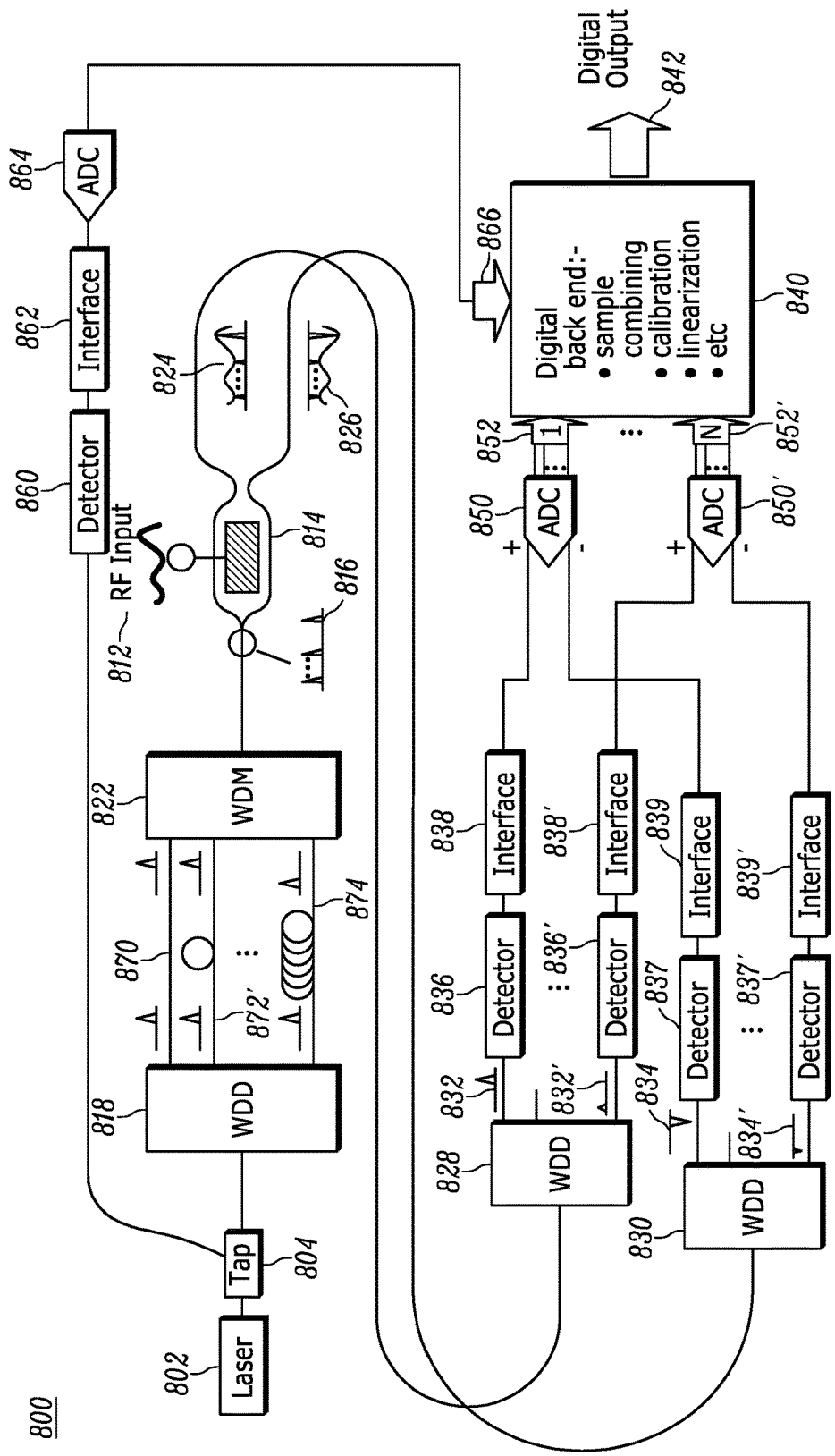
FIG. 8 illustrates an embodiment of the photonically-sampled electronically-quantized analog-to-digital converter that uses wavelength interleaving and routing (WIR), as well as single-channel normalization, passive detector-to-ADC interfaces and subtraction before the ADCs according to the present teaching.

FIG. 8 illustrates an embodiment of the photonically-sampled electronically-quantized analog-to-digital converter 800 according to the present teaching that advantageously uses multiple wavelengths to achieve both interleaving and routing (WIR) of the sample pulses. The photonically-sampled electronically-quantized analog-to-digital converter 800 uses a complementary-output optical modulator, such the Mach-Zehnder modulator 814 shown in FIG. 8 with a passive detector-to-ADC interface and subtraction prior to the ADC, both of which were described in connection with FIG. 7 combined with the single-channel normalization described in connection with FIG. 6.

Ideally the sampling waveform would be a train of impulse functions, i.e. pulses of zero width in time. Since no such waveform can be generated by an actual system, the sampling waveform of the present teaching approximates this ideal case by sampling with a pulse width that is less than a particular fraction of a period of the frequency of the sampled waveform. In one particular embodiment of the present teaching, a waveform is sampled with a sampling pulse that is $<\frac{1}{10}$ of the period of the highest frequency in the waveform to be sampled. This has been found to effective.

There are two key design parameters that determine the number of pulses that can be interleaved from a single laser pulse: (1) the spectral bandwidth of the laser pulse; and (2) the desired width of the sampling pulse, which is related to the maximum electrical frequency to be sampled. Consider, for example, an electrical waveform with a bandwidth of 10 GHz. The period of this waveform is $\frac{1}{10^{10}}$ Hz=$10^{-10}$ seconds, or 100 picoseconds. To effectively sample this waveform would require a sampling pulse of width $\Delta t < 10$ picoseconds. If one assumes that the shape of the pulses in the sampling waveform is approximately Gaussian, then it is well known to those skilled in the art that the product of the minimum time and the bandwidth product of a Gaussian pulse, $\Delta t \times \Delta f = 0.441$. Hence, the bandwidth of the sampling waveform Δf=0.441/10⁻¹¹=44.1 GHz, or equivalently 0.35 nm in wavelength, where we have converted the bandwidth in frequency in Hz to a bandwidth in wavelength in meters using the well-known relationship $\Delta f/f = \Delta\lambda/\lambda$ and assuming a nominal center wavelength of $\lambda = 1.55 \times 10^{-6}$ m. Lasers are presently commercially available that generate narrow pulses that have an optical bandwidth of >30 nm. Hence using such a laser, it is possible to divide each laser pulse into $30/\Delta\lambda = 85$ separate pulses, each with a different wavelength. Various embodiments will use a number of wavelengths that is based on the spectral bandwidth of the laser pulse and on the electrical frequency of the signal to be sampled, as described herein.

A laser 802, or other optical source known in the art, generates an optical signal including a train of optical pulses where each of the pulses includes multiple wavelengths. The optical signal is split by a tap or splitter 804. A first output of the splitter 804, which feeds the single-channel normalization channel, is optically coupled to a detector 860. An output of the detector 860 is electrically coupled to a passive detector-to-ADC interface 862. In some embodiments, the interface 862 is a low-pass filter (LPF). An output of the interface 862 is electrically connected to an analog input of the reference analog-to-digital converter 864. The digital output of the reference analog-to-digital converter 864 is electrically connected to an input 866 of the digital signal processor 840.

Referring back to FIGS. 6-7C, in some embodiments of the photonically-sampled, electronically quantized ADC the rate of optical pulses from the optical source 602, 702 is equal to the rate of optical pulses in the sampling pulse train 612, 716. In other embodiments, it may be desirable or necessary to achieve a faster rate from pulse train 612, 716 than the rate of pulses from the optical source 602, 702, 732, 752. Referring to FIG. 7C, to achieve a faster sampling pulse train rate, an interleaver can be inserted between the output of the tap 754 and the input to the modulator 764. Both time and wavelength interleavers can be used in the photonically-sampled, electronically-quantized ADC of the present teaching.

Referring again to FIG. 8, a second output of the splitter 804 is optically coupled to a wavelength interleaver portion of the wavelength interleaver and router (WIR). The wavelength interleaver includes the wavelength division demultiplexer (WDD) 818. The WDD 818 separates each of the multiple wavelength pulses into separate outputs. The outputs of the WDD 818 are optically coupled to a plurality of optical delay elements that can be implemented in a number of ways; FIG. 8 shows using optical fibers 870, 872, and 874. Each of the plurality of optical delay elements comprising optical fibers 870, 872, and 874 provides a desired relative time delay between each of the different wavelength optical pulse trains. An output of each of the plurality of optical delay elements comprising optical fibers 870, 872, and 874 is optically coupled to a respective input of a wavelength division multiplexer (WDM) 822 so that the relative time-delay optical pulse trains with different wavelengths are recombined in the WDM 822. The WDM 822 generates at an output a pulse train consisting of multiple optical pulses each with different wavelengths, each in a different time slot. The resulting output of the wavelength interleaver provides an interleaved optical sampling signal 816. A wavelength interleaver has the additional advantage that the wavelength encoding of the sampling pulses means that a wavelength demultiplexer can be used to implement a particularly simple form of the optical pulse demultiplexer. For an example of wavelength demultiplexing in a system using photonic ADC, see A. H. Nejadmalayeri, et. al., "A 16-fs aperture jitter photonic ADC: 7.0 ENOB at 40 GHz", Proc. Conf. on Lasers and Electro-optics (CLEO), 2011, paper CThI4.

The output of the wavelength interleaver at the output of WDM 822 is optically coupled to an input of an optical modulator 814 with balanced outputs, which is shown in FIG. 8 as a Mach-Zehnder modulator. The optical sampling signals 816 are then modulated by the modulator 814. The modulator 814 imposes an RF modulation signal from RF input 812 on the optical sampling signals 816, and generates complementary outputs of an optically-sampled signal, so-called positive optically-sampled signal 824 and so-called negative optically-sampled signal 826. These complementary outputs represent sampled, equal and opposite amplitudes of the RF signal.

A first output of the optical modulator 814, which generates a positive optically-sampled signal 824, is optically coupled to an input of a WDD 828, which provides the routing portion of the WIR. The WDD 828 generates a plurality of wavelength demultiplexed outputs 832, 832' of the positive optically-sampled signal 824 at a plurality of outputs. A second output of the optical modulator 814, which generates a negative optically-sampled signal 826, is optically coupled to an input of a WDD 830. The WDD 830 generates a plurality of wavelength demultiplexed signals 834, 834' of the negative optically-sampled stream 826 at a plurality of outputs. The router part of the WIR uses a readily available component, a WDD, to perform the function of the optical pulse demultiplexer without the need for a massive, custom optical switch. Such a switch is shown in prior art presented in FIG. 1 element 106 and FIG. 3 element 310. Hence, embodiments of the present teaching including WIR removes one of the main impediments to a practical realization of a photonically-sampled, electronically-quantized ADC.

Each of the plurality of outputs of the WDD 828 is optically coupled to an input of a respective one of a plurality of optical detectors 836, 836' that detect a respective one of the plurality of wavelength demultiplexed signals 832, 832'. Each electrical output of the plurality of optical detectors 836, 836' is electrically connected to an input of a respective one of a plurality of passive detector-to-ADC interfaces 838, 838'. Similarly, each of the plurality of outputs of the WDD 830 is optically coupled to an input of a respective one of a plurality of optical detectors 837, 837' that detect a respective one of the plurality of wavelength demultiplexed signals 834, 834'. Each electrical output of the plurality of optical detectors 837, 837' is electrically connected to an input of a respective one of a plurality of passive detector-to-ADC interfaces 839, 839'.

Each output of the plurality of interfaces 838, 838' is electrically connected to a positive input of a respective one of a plurality of analog-to-digital-converters 850, 850'. Each output of the plurality of interfaces 839, 839' is electrically connected to a negative input of a respective one of a plurality of analog-to-digital-converters 850, 850'. Each of the plurality of analog-to-digital converters 850, 850' is receiving one particular sample of the RF signal 812 that was encoded on a particular wavelength. The plurality of analog-to-digital-converters 850 generates N outputs 852, 852', which are electrically connected to N inputs of digital signal processor 840. The digital signal processor 840 provides a digital output 842. The digital output 842 is a digital representation of the RF modulation signal at the RF input 812, which can be one of various known formats, including serial or parallel, high bandwidth and/or low bandwidth, depending on the particular known digital signal processing electronics that is used. The digital signal processor 840 uses the output of the reference analog-to-digital converter 864 to improve signal integrity of the digital representation of the input RF signal by normalization, linearization, noise cancellation and AM sideband suppression.

A key insight of the present teaching is that essentially all the optical intensity noise from the laser is at frequencies that are less than half the pulse repetition rate because any higher frequency noise is aliased back into this frequency range according to the Nyquist sampling theory. The single-channel normalization is thus able to cover the entire frequency range of the input optical intensity noise. Differences in channel transmission through the pulse demultiplexer, such as demultiplexer 768 in FIG. 7C or the WIR as shown in FIG. 8, appear as channel gain offsets, not as noise. These differences in channel transmission can be compensated by routine analog-to-digital converter calibration algorithms.

Figure 9:
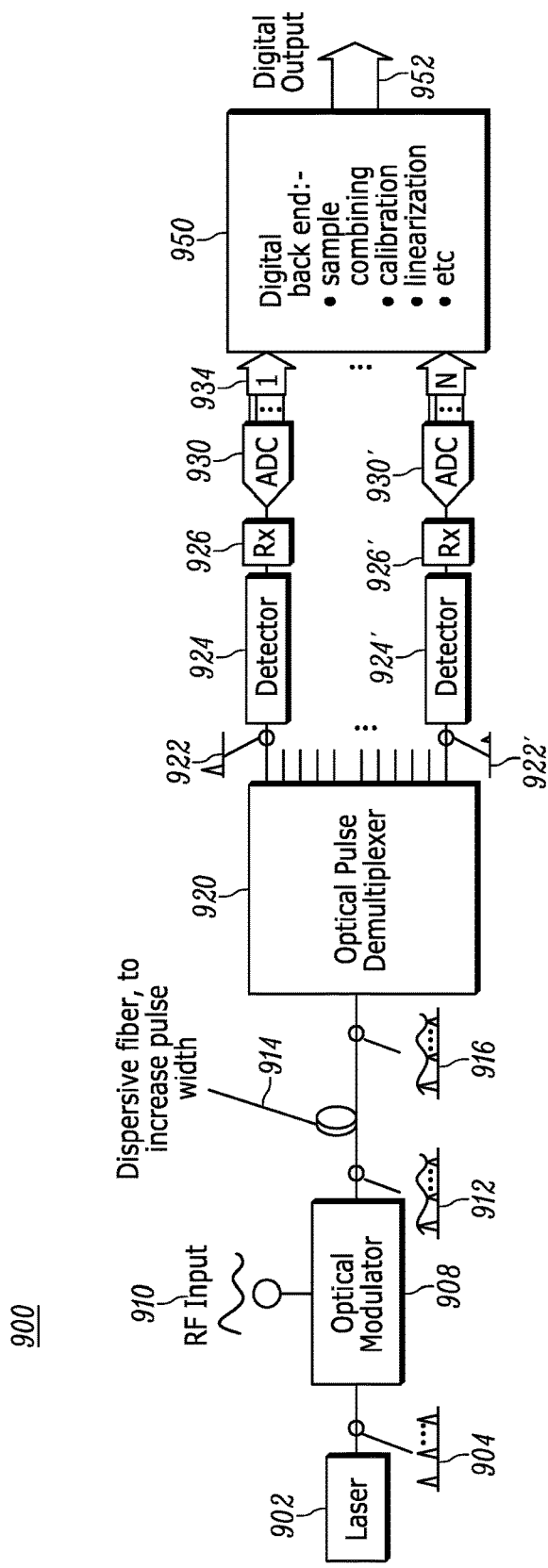
FIG. 9 illustrates an embodiment of the photonically-sampled electronically-quantized analog-to-digital converter of the present teaching comprising post-modulator dispersion.

FIG. 9 illustrates an embodiment of the photonically-sampled electronically-quantized analog-to-digital converter 900 of the present teaching that includes a dispersive component located after the modulator. The analog-to-digital converter 900 includes an optical source, such as a laser 902 that generates a train of optical sampling pulses 904. The output of the laser 902 is optically coupled to an input of the optical modulator 908. The optical modulator 908 modulates an RF modulation signal applied to the input 910 onto the sampling pulses generated by the laser 902 to produce the optically sampled signal 912. The optical sampling pulses, and resulting optically sampled signal comprise short duration optical pulses.

The output of the optical modulator is coupled to an input of the optical pulse demultiplexer 920 with a dispersive optical element 914. The dispersive optical element 914 increases the width of the pulses. The dispersive optical element can be any dispersive element known in the art. A fiber Bragg grating can be used to implement the dispersive optical element. The dispersive optical element can also be a length of dispersive optical fiber in which the amount of dispersion in the dispersive optical fiber 914 and the length of the optical dispersive fiber 914 are chosen so as to provide an appropriate pulse length for a given application and/or to optimize detection. Because short pulses have large optical bandwidths in some embodiments, only a few hundred meters of dispersive fiber 914 are required.

The dispersive optical element 914 can be positioned anywhere between the optical modulator 908 and the plurality of detectors 924, 924'. In some embodiments, the dispersive optical element 914 is positioned immediately after the optical modulator 908 as shown in FIG. 9. In other embodiments, the dispersive optical element 914 is positioned immediately before the plurality of optical detectors 924, 924'. In some embodiments, the total dispersion may be achieved by using multiple dispersive optical elements. Continuing the example of using dispersive optical fiber to implement the dispersive optical element 914, some of the length of the dispersive optical fiber is positioned at one location in the photonic analog-to-digital converter, and the remainder of the length of dispersive fiber is positioned at one or more other locations in the photonic analog-to-digital converter. It should be understood that the dispersive element of the present teaching can be used in various other embodiments that do not include a demultiplexer. It will be understood by those skilled in the art that these embodiments only include a single detector and single analog-to-digital converter.

In the embodiment shown in FIG. 9, the output of the dispersive optical element 914 is optically coupled to an input of the optical pulse demultiplexer 920. The optical pulse demultiplexer 920 demultiplexes the sampled, and if preceded by a dispersive optical element, dispersed optical pulse train 916 into multiple output ports. In some embodiments, the optical demultiplexer 920 splits the incoming optical signal into a plurality of output ports based on the time slot of the optical pulse. Each of the plurality of demultiplexer output ports is optically coupled to a respective one of a plurality of optical detectors 924, 924'. The optical detectors 924, 924' convert the demultiplexed dispersed optical pulse trains 922, 922' into an electrical signal. The dispersed optical pulse trains comprise longer-duration pulses than the short pulses of optically sampled signal 912.

The output of each of the plurality of optical detectors 924, 924' is electrically connected to an input of a respective one of a plurality of electrical receivers 926, 926' that condition the signals. The output of each of the plurality of the electrical receivers 926, 926' is electrically connected to the input of a respective one of the plurality of analog-to-digital converters 930, 930'.

The embodiment illustrated in FIG. 9 shows a bank of electrical receivers 926, 926' that connect the detectors 924, 924' to the ADC 930, 930'. Alternatively, other embodiments may utilize a passive interface instead of the receiver 926, 926' to connect the detector 924, 924' to the ADC 930, 930'. The dispersive optical element may be utilized in conjunction with any of the embodiments shown in FIGS. 6, 7 and/or 8.

The plurality of analog-to-digital converters 930, 930' convert the electrical analog signals to digital signals. The plurality of analog-to-digital-converters 930, 930' generates N outputs 934,934', which are electrically connected to N inputs of a digital signal processor 950. The digital signal processor 950 provides a digital output 952. The resulting digital output 952 is a digital representation of the RF modulation at input 910, which can be one of various known formats, including serial or parallel, straight binary or Gray code, high bandwidth and/or low bandwidth, depending on the particular known digital back end signal processing used.

One feature of the embodiment shown in FIG. 9 is that it beneficially avoids what was heretofore believed to be fundamentally opposing constraints on the width of the optical sampling pulse that forced designers to either compromise on optical pulse width and/or the complex circuitry required to manage the performance with regard to pulse width of prior art photonic analog-to-digital converters. The analog-to-digital converter of the present teaching performs sampling with short pulses, but the detection and subsequent processing are conducted on longer, dispersed pulses. As such, the response roll-off of known systems as described in connection with FIG. 4 takes on substantially the value associated with the sampling, short, pulse durations. However, detection is efficient using the longer dispersed pulses with lower peak power avoiding detector nonlinearity and lower noise owing to lower bandwidth pulse leading and trailing edges. Furthermore, the effective number of bits for the embodiment shown in FIG. 9 would take on the substantially the value associated with the longer pulses in the receive chain of the system, thus the effective number of bits is higher, as described in conjunction with FIG. 5.

As the performance of analog-to-digital converters improves, it has become possible to move the analog-to-digital converter forward in the receive chain, i.e. move it closer to the antenna with the ultimate objective to have the analog-to-digital converter connected directly to the antenna output. One factor that is presently limiting achieving this objective is the noise figure of prior art analog-to-digital converters, which is presently limited to about 20 dB. The noise figure of state-of-the-art RF receivers is less than 6 dB. Hence at a minimum, a low noise amplifier is needed between the antenna and the analog-to-digital converter. The present lower bound on the noise figure of prior-art, high-speed, analog-to-digital converters is fundamentally set by a combination of electronic sampling and the flash topology used to implement them.

Unlike electronic sampling, photonic sampling can provide the necessary gain, with low noise figure, prior to the electronic analog-to-digital converter. As is well known in the art, inserting a stage with sufficient low-noise gain before a stage with higher noise figure can reduce the overall noise figure of the gain plus high noise figure stage. One feature of the present teaching is the recognition that the gain that photonic sampling can provide, can make it possible to sample directly the output of an antenna and do so with sufficiently low noise figure to make such an approach competitive with the noise figure that can be achieved with a low noise amplifier.

Wide bandwidth photonic links with gain and low noise figure have been demonstrated; see for example E. I. Ackerman, et al, "Signal-to-noise performance of two analog photonic links using different noise reduction techniques," 2007 International Microwave Symposium Conference Digest, pp. 51-54, Jun. 3-8, 2007. Prior art system designs fail to realize that photonic sampling can be considered to be a type of optical link, but unlike a conventional optical link where both the input and output are continuous signals, a photonic sampler performs equivalent functions of an optical link in which the input is continuous but the output occurs only at discrete instants in time, which are commonly referred to as samples. A photonic sampler with gain and low noise figure in conjunction with an electronic quantizer, i.e. an electronic analog-to-digital converter, can produce a system with a sufficiently low noise figure to sample directly the output of an antenna.

Architecture of the electronically-quantized analog-to-digital converter system with low noise figure can be similar to the known photonic analog-to-digital converter architecture of FIG. 1, or to any of the new architectures described in connection with FIGS. 6 through 9. A pulsed laser provides a high-speed, low-jitter pulse train to the modulator. The output of the modulator is a train of pulses representing a sampled version of the electrical input signal that is to be converted to a digital representation. These pulses are sequentially sent to an optical pulse demultiplexer. A plurality of optical detectors is optically coupled to the output of the optical pulse demultiplexer. Each of the plurality of detectors is electrically connected to one of a plurality of electronic receivers which typically contain active electronic devices and/or circuits that amplify, provide impedance transformation. The electronic receivers provide the interface between the output of the detectors and the input to the electronic ADC. In some embodiments, the receivers are replaced by passive interfaces described earlier. Each of the plurality of electronic receivers is then electronically connected to one of a plurality of electronic analog-to-digital converters so that each electronic analog-to-digital converter only sees pulses at its electronic sampling rate. The electronic sampling rate of each analog-to-digital converter is many times slower than the optical sampling rate. A digital back end process unit is then used for various processing tasks. The optical pulse power is chosen to be large enough so that the equivalent input noise of the photonic ADC (at the RF input 610 shown in FIG. 6, for example) is smaller than the equivalent input noise at the input of the electronic ADCs (at the inputs to the ADCs 630 shown in FIG. 6, for example). This is possible because, as the optical power increases, the variation in the pulse amplitude at the output of the receivers 626 caused by a varying voltage at the photonic ADC input 610 to become larger. When the output pulse amplitude variation becomes larger than the input voltage variation of the signal, there is gain and the equivalent input noise at the photonic ADC input becomes smaller than the equivalent input noise of the electronic ADC. This simple description assumes the equivalent input noise of the photonic ADC is dominated by the equivalent input noise of the electronic ADC. This is possible by careful design of the photonic front end to minimize photonic noise sources, such as laser intensity noise and optical amplifier noise. Techniques for this are well known; see, for example, E. I. Ackerman, et al, "Signal-to-noise performance of two analog photonic links using different noise reduction techniques," 2007 International Microwave Symposium Conference Digest, pp. 51-54, Jun. 3-8, 2007.

EQUIVALENTS

While the Applicant's teaching is described in conjunction with various embodiments, it is not intended that the Applicant's teaching be limited to such embodiments. On the contrary, the Applicant's teaching encompass various alternatives, modifications, and equivalents, as will be appreciated by those of skill in the art, which may be made therein without departing from the spirit and scope of the teaching.

What is claimed is:

1. A photonically-sampled electronically-quantized analog-to-digital converter comprising:
   a) an optical transmitter that generates an optical signal comprising a series of optical pulses;
   b) an optical splitter having an input that is optically coupled to an output of the optical transmitter and a first and second output;
   c) a reference optical detector having an optical input that is directly coupled to the first output of the optical splitter so that the series of optical pulses propagate in a path directly to the reference optical detector and having an output that is electrically connected to a reference analog-to-digital converter that generates a reference digital signal that represents the optical signal;
   d) an optical modulator having an optical input that is coupled to the second output of the optical splitter and having an RF input that receives an input RF modulation signal, the optical modulator generating an RF-modulated optically-sampled signal at an output that is coupled to an input of an optical pulse demultiplexer that generates a plurality of demultiplexed RF-modulated optically-sampled signals at a plurality of outputs;
   e) a plurality of optical detectors, an input of a respective one of the plurality of optical detectors being optically coupled to an output of a respective one of the plurality of outputs of the optical pulse demultiplexer, an output of each of the plurality of optical detectors being electrically connected to an input of a respective one of a plurality of signal analog-to-digital converters; and
   f) a digital signal processor having a plurality of inputs, a respective one of the plurality of inputs of the digital signal processor being electrically connected to a respective output of the plurality of signal analog-to-digital converters and having a reference input electrically connected to the output of the reference analog-to-digital converter, the digital signal processor generating a digital representation of the input RF modulation signal, wherein the digital signal processor uses the reference digital signal to provide an improved signal integrity of the digital representation of the input RF modulation signal.

2. The photonically-sampled electronically-quantized analog-to-digital converter of claim 1 wherein the optical transmitter generates the optical signal comprising a series of substantially equal-amplitude optical pulses.

3. The photonically-sampled electronically-quantized analog-to-digital converter of claim 1 wherein the optical transmitter generates the optical signal comprising a series of optical pulses with uniform pulse spacing.

4. The photonically-sampled electronically-quantized analog-to-digital converter of claim 1 wherein the optical transmitter generates the optical signal comprising a series of optical pulses with non-uniform pulse spacing.

5. The photonically-sampled electronically-quantized analog-to-digital converter of claim 1 wherein the optical pulse demultiplexer generates the plurality of demultiplexed RF-modulated optically-sampled signals comprising a time slot of the optical signal.

6. The photonically-sampled electronically-quantized analog-to-digital converter of claim 1 wherein the improved signal integrity includes at least one of normalization, linearization, noise cancellation, and AM sideband suppression on the digital representation of the input RF modulation signal.

7. The photonically-sampled electronically-quantized analog-to-digital converter of claim 1 wherein the optical modulator comprises a Mach-Zehnder modulator.

8. The photonically-sampled electronically-quantized analog-to-digital converter of claim 1 wherein the optical modulator comprises a complementary output modulator.

9. The photonically-sampled electronically-quantized analog-to-digital converter of claim 1 further comprising a passive electrical interface having an input connected to the output of the reference optical detector and an output connected to an input of the reference analog-to-digital converter.

10. The photonically-sampled electronically-quantized analog-to-digital converter of claim 1 wherein the reference optical detector comprises a passive electrical interface.

11. The photonically-sampled electronically-quantized analog-to-digital converter of claim 1 wherein the reference analog-to-digital converter comprises a passive electrical interface.

12. The photonically-sampled electronically-quantized analog-to-digital converter of claim 1 further comprising a receiver having an input connected to the output of the reference optical detector and an output connected to an input of the reference analog-to-digital converter.

13. The photonically-sampled electronically-quantized analog-to-digital converter of claim 1 wherein the output of the optical modulator comprises a positive output and a negative output.

14. The photonically-sampled electronically-quantized analog-to-digital converter of claim 13 wherein the optical pulse demultiplexer comprises a first and a second optical pulse demultiplexer, an input of the first optical pulse demultiplexer being optically coupled to the positive output of the optical modulator and an input of the second optical pulse demultiplexer being optically coupled to the negative output of the optical modulator, and wherein the plurality of signal analog-to-digital converters comprise a plurality of positive inputs connected to corresponding respective ones of the plurality of outputs of the first optical pulse demultiplexer and comprise a plurality of negative inputs connected to corresponding ones of a respective plurality of outputs of the second optical pulse demultiplexer.

15. The photonically-sampled electronically-quantized analog-to-digital converter of claim 13 further comprising a WDM interleaver having an input optically coupled into the second optical path and an output that is optically coupled to the input of the optical modulator, the WDM interleaver generating at an output multiple optical pulse trains with different wavelengths, wherein each wavelength occupies a particular time slot, and wherein each time slot repeats with a particular frequency.

16. The photonically-sampled electronically-quantized analog-to-digital converter of claim 1 wherein the digital signal processor is configured to combine signals.

17. The photonically-sampled electronically-quantized analog-to-digital converter of claim 1 wherein the digital signal processor is configured to perform calibration.

18. The photonically-sampled electronically-quantized analog-to-digital converter of claim 1 wherein the digital signal processor performs a linearization function.

19. A method of photonically-sampled electronically-quantized analog-to-digital conversion, the method comprising:
   a) generating an optical signal comprising a series of optical pulses;
   b) splitting the optical signal into a first and a second optical path;
   c) directly detecting the split optical signal comprising the series of optical pulses in the first path and converting the detected optical signal to a reference digital signal;
   d) modulating the split optical signal in the second path with an input RF modulation signal and generating a plurality of demultiplexed RF-modulated optically-sampled signals from the modulated optical signal;
   e) detecting the plurality of demultiplexed RF-modulated optically-sampled signals and converting the detected plurality of demultiplexed RF-modulated optically-sampled signals to a plurality of sampled-RF digital signals; and
   f) digital signal processing the reference digital signal and the plurality of sampled-RF digital signals to generate a digital representation of the input RF modulation signal.

20. The method of claim 19 wherein the series of optical pulses comprises a series of substantially equal-amplitude optical pulses.

21. The method of claim 19 wherein the series of optical pulses comprise uniformly spaced pulses.

22. The method of claim 19 wherein the series of optical pulses comprise non-uniformly space pulses.

23. The method of claim 19 wherein the digital signal processing comprises combining the plurality of sampled-RF digital signals.

24. The method of claim 19 wherein the digital signal processor comprises linearizing the plurality of sampled-RF digital signals.

25. The method of claim 19 wherein the modulating the split optical signal in the second path with the input RF modulation signal comprises generating a positive modulation signal and a complementary negative modulation signal.

26. The method of claim 25 wherein the generating the plurality of demultiplexed RF-modulated optically-sampled signals from the modulated optical signal comprises generating a first plurality of demultiplexed RF-modulated optically-sampled signals from the positive modulation signal and generating a second plurality of demultiplexed RF-modulated optically-sampled signals from the negative modulation signal.

27. A photonically-sampled electronically-quantized analog-to-digital converter comprising:
 a) an optical transmitter that generates an optical signal comprising a series of optical pulses;
 b) an optical modulator having an RF input that receives an input RF modulation signal and an output that generates a modulated optical signal wherein the optical pulses sample the input RF modulation signal;
 c) a dispersive optical element having an input that is optically coupled to the output of the optical modulator, the dispersive optical element increasing a width of the optical pulses of the modulated optical signal;
 d) an optical pulse demultiplexer having an input that is coupled to an output of the dispersive optical fiber, the optical pulse demultiplexer generating a plurality of demultiplexed RF-modulated optically-sampled signals at a plurality of outputs;
 e) a plurality of optical detectors, an input of a respective one of the plurality of optical detectors being optically coupled to an output of a respective one of the plurality of outputs of the optical pulse demultiplexer, an output of each of the plurality of optical detectors being electrically connected to an input of a respective one of a plurality of analog-to-digital converters; and
 f) a digital signal processor having a plurality of inputs electrically connected to an output of a respective one of the plurality of analog-to-digital converters, the digital signal processor generating a digital representation of the input RF signal.

28. The photonically-sampled electronically-quantized analog-to-digital converter of claim 27 wherein the dispersive optical element is configured so as to provide a desired pulse length.

29. The photonically-sampled electronically-quantized analog-to-digital converter of claim 27 wherein the dispersive optical element is configured to lower a noise of the photonically-sampled electronically-quantized analog-to-digital converter.

30. The photonically-sampled electronically-quantized analog-to-digital converter of claim 27 wherein the dispersive optical element is configured to lower a power of the optical pulses to a level that reduces nonlinearities in the plurality of optical detectors.

31. The photonically-sampled electronically-quantized analog-to-digital converter of claim 27 wherein the series of optical pulses comprises a series of substantially equal-amplitude optical pulses.

32. The photonically-sampled electronically-quantized analog-to-digital converter of claim 27 wherein the optical transmitter generates the series of optical pulses with uniformly spacing.

33. The photonically-sampled electronically-quantized analog-to-digital converter of claim 27 wherein the optical transmitter generates the series of optical pulses with non-uniformly spacing.

34. The photonically-sampled electronically-quantized analog-to-digital converter of claim 27 wherein each of the plurality of demultiplexed RF-modulated optically-sampled signals comprises a time slot of the optical signal.

35. The photonically-sampled electronically-quantized analog-to-digital converter of claim 27 wherein the digital signal processor is configured to perform a combining function.

36. The photonically-sampled electronically-quantized analog-to-digital converter of claim 27 wherein the digital signal processor is configured to perform a digital noise cancellation function.

37. The photonically-sampled electronically-quantized analog-to-digital converter of claim 27 wherein the digital signal processor is configured to perform a calibration function.

38. The photonically-sampled electronically-quantized analog-to-digital converter of claim 27 wherein the digital signal processor is configured to perform a linearization function.

39. The photonically-sampled electronically-quantized analog-to-digital converter of claim 27 wherein the dispersive optical element comprises a length of optical fiber.

40. A photonically-sampled electronically-quantized analog-to-digital converter comprising:
 a) an optical transmitter that generates an optical signal comprising a series of optical pulses;
 b) an optical modulator having an RF input that receives an input RF modulation signal and an output that generates a modulated optical signal wherein the optical pulses sample the input RF modulation signal;
 c) an optical pulse demultiplexer having an input that is coupled to an output of the optical modulator, the optical pulse demultiplexer generating a plurality of demultiplexed RF-modulated optically-sampled signals at a plurality of outputs;
 d) a plurality of dispersive optical elements each of the plurality of dispersive optical elements having an input that is optically coupled to a respective one of the plurality of outputs of the optical pulse demultiplexer, the plurality of dispersive optical elements increasing a width of the optical pulses;
 e) a plurality of optical detectors, an input of a respective one of the plurality of optical detectors being optically coupled to an output of a respective one of the plurality of dispersive optical elements, an output of each of the plurality of optical detectors being electrically connected to an input of a respective one of a plurality of analog-to-digital converters; and
 f) a digital signal processor having a plurality of inputs, each of the plurality of inputs of the digital signal processor being electrically connected to an output of a respective one of the plurality of analog-to-digital converters, the signal processor generating a digital representation of the input RF signal.

41. A photonically-sampled electronically-quantized analog-to-digital converter comprising:
 a) an optical transmitter that generates an optical signal comprising a series of optical pulses;
 b) an optical modulator having an input that is optically coupled to an output of the optical transmitter and an RF input that receives an input RF modulation signal and that generates an RF-modulated optically-sampled signal at an output that is coupled to an input of an optical pulse demultiplexer that generates a plurality of demultiplexed RF-modulated optically-sampled signals at a plurality of outputs;
 c) a plurality of optical detectors, an input of a respective one of the plurality of optical detectors being optically coupled to an output of a respective one of the plurality of outputs of the optical pulse demultiplexer, an output of each of the plurality of optical detectors being electrically connected to an input of a respective one of a plurality of passive electrical interfaces, and output of each of the plurality of passive electrical interfaces being electrically connected to an input of a respective one of a plurality of signal analog-to-digital converters; and d) a digital signal processor having a plurality of inputs electrically connected to a respective output of the plurality of signal analog-to-digital converters, the digital signal processor generating a digital representation of the input RF modulation signal, wherein the outputs of the plurality of passive electrical interfaces drive the respective ones of the inputs of the plurality of signal analog-to-digital converters with a current that achieves greater than half-scale.

42. The photonically-sampled electronically-quantized analog-to-digital converter of claim 41 wherein the outputs of the plurality of passive electrical interfaces drive the respective ones of the plurality of inputs of the signal analog-to-digital converters with a current that achieves substantially full scale.

43. A photonically-sampled electronically-quantized analog-to-digital converter comprising:
a) an optical transmitter that generates an optical signal comprising a series of optical pulses;
b) a complementary output optical modulator having an input that is optically coupled to an output of the optical transmitter and an RF input that receives an input RF modulation signal and that generates an RF-modulated optically-sampled signal at a positive output that is coupled to an input of a first optical pulse demultiplexer that generates a plurality of demultiplexed RF-modulated optically-sampled signals at a plurality of outputs and a negative output that is coupled to an input of a second optical pulse demultiplexer that generates a plurality of demultiplexed RF-modulated optically-sampled signals at a plurality of outputs;
c) a first plurality of optical detectors, an input of a respective one of the first plurality of optical detectors being optically coupled to an output of a respective one of the plurality of outputs of the first optical pulse demultiplexer, an output of each of the first plurality of optical detectors being electrically connected to a positive input of a respective one of a plurality of signal analog-to-digital converters;
d) a second plurality of optical detectors, an input of a respective one of the second plurality of optical detectors being optically coupled to an output of a respective one of the plurality of outputs of the second optical pulse demultiplexer, an output of each of the second plurality of optical detectors being electrically connected to a negative input of a respective one of the plurality of signal analog-to-digital converters; and
e) a digital signal processor having a plurality of inputs electrically connected to a respective output of the plurality of signal analog-to-digital converters, the digital signal processor generating a digital representation of the input RF modulation signal, wherein at least one of the plurality of signal analog-to-digital converters is configured to perform a subtraction of a signal from the positive input of the at least one signal analog-to-digital converter and a signal from the negative input of the at least one signal analog-to-digital converter that serves to cancel an input optical intensity noise.

44. A photonically-sampled electronically-quantized analog-to-digital converter comprising:
a) an optical transmitter that generates an optical signal comprising a series of optical pulses;
b) an optical modulator having an optical input that is optically coupled to an output of the optical transmitter and an RF input that receives an input RF modulation signal and that generates an RF-modulated optically-sampled signal at an output, the output being coupled to a dispersive optical element that increases a width of the optical pulses of the modulated optical signal and couples the modulated optical signal to an input of an optical pulse demultiplexer that generates a plurality of demultiplexed RF-modulated optically-sampled signals at a plurality of outputs;
c) a plurality of optical detectors, an input of a respective one of the plurality of optical detectors being optically coupled to an output of a respective one of the plurality of outputs of the optical pulse demultiplexer, an output of each of the plurality of optical detectors being electrically connected to an input of a respective one of a plurality of passive electrical interfaces, and output of each of the plurality of passive electrical interfaces being electrically connected to an input of a respective one of a plurality of signal analog-to-digital converters; and
d) a digital signal processor having a plurality of inputs electrically connected to a respective output of the plurality of signal analog-to-digital converters, the digital signal processor generating a digital representation of the input RF modulation signal, wherein the optical transmitter is configured to generate the optical signal comprising the series of optical pulses with an optical pulse power level that produces an equivalent input noise at the RF input that is less than an equivalent input noise at the input of the analog-to-digital converter.

45. A photonically-sampled electronically-quantized analog-to-digital converter comprising:
a) an optical transmitter that generates an optical signal comprising a series of optical pulses;
b) an optical modulator having an RF input that receives an input RF modulation signal and an output that generates a modulated optical signal wherein the optical pulses sample the input RF modulation signal;
c) a dispersive optical element having an input that is optically coupled to the output of the optical modulator, the dispersive optical element increasing a width of the optical pulses of the modulated optical signal;
d) an optical detector having an input optically coupled to an output of the dispersive optical element and having an output that is electrically connected to an input an analog-to-digital converter; and
e) a digital signal processor having an input electrically connected to an output of an analog-to-digital converter, the digital signal processor generating a digital representation of the input RF signal.

46. A photonically-sampled electronically-quantized analog-to-digital converter comprising:
a) an optical transmitter that generates an optical signal comprising a series of optical pulses;
b) an optical modulator having an input that is optically coupled to an output of the optical transmitter and an RF input that receives an input RF modulation signal and that generates an RF-modulated optically-sampled signal at an output;

c) an optical detector having an input that is optically coupled to the output of the optical modulator and having an output that is electrically connected to an input of a passive electrical interface, an output of the passive electrical interface being electrically connected to an input of an analog-to-digital converter; and
d) a digital signal processor having an input electrically connected to an output of the analog-to-digital converter, the digital signal processor generating a digital representation of the input RF modulation signal,
wherein the photonically-sampled electronically-quantized analog-to-digital converter is configured such that the output of the passive electrical interface drives the input of the analog-to-digital converter with a current that achieves greater than half-scale.

47. The photonically-sampled electronically-quantized analog-to-digital converter of claim 46 wherein the photonically-sampled electronically-quantized analog-to-digital converter is configured such that the output of the passive electrical interface drives the input of the analog-to-digital converter with a current that achieves substantially full scale.

48. A photonically-sampled electronically-quantized analog-to-digital converter comprising:
    a) an optical transmitter that generates an optical signal comprising a series of optical pulses;
    b) a complementary output optical modulator having an input that is optically coupled to an output of the optical transmitter and an RF input that receives an input RF modulation signal and that generates an RF-modulated optically-sampled signal at a positive output and at a negative output;
    c) a first optical detector having an input that is optically coupled to the positive output of the complementary output optical modulator and an output that is electrically connected to a positive input of an analog-to-digital converter;
    d) a second optical detector having an input that is optically coupled to the negative output of the complementary output optical modulator and an output that is electrically connected to a negative input of the analog-to-digital converter; and
    e) a digital signal processor having an input that is electrically connected to an output of the analog-to-digital converter, the digital signal processor generating a digital representation of the input RF modulation signal,
    wherein the analog-to-digital converter performs a subtraction of a signal from the positive input of the analog-to-digital converter and a signal from the negative input of the analog-to-digital converter that serves to cancel an input optical intensity noise.

49. A photonically-sampled electronically-quantized analog-to-digital converter comprising:
    a) an optical transmitter that generates an optical signal comprising a series of optical pulses;
    b) an optical modulator having an input that is optically coupled to an output of the optical transmitter and an RF input that receives an input RF modulation signal and that generates an RF-modulated optically-sampled signal at an output;
    c) an optical detector having an input that is optically coupled to the output of the optical modulator and an output electrically connected to an input of a passive electrical interface, an output of the passive electrical interfaces being electrically connected to an input of an analog-to-digital converter; and
    d) a digital signal processor having an input that is electrically connected to an output of the analog-to-digital converter, the digital signal processor generating a digital representation of the input RF modulation signal,
    wherein the optical transmitter is configured to generate the optical signal comprising the series of optical pulses with an optical pulse power level that produces an equivalent input noise at the RF input that is less than an equivalent input noise at the input of the analog-to-digital converter.

* * * * *